United States Patent
Schwab et al.

(10) Patent No.: US 10,545,323 B2
(45) Date of Patent: Jan. 28, 2020

(54) PROJECTION OPTICAL UNIT FOR EUV PROJECTION LITHOGRAPHY

(71) Applicant: Carl Zeiss SMT GmbH, Oberkochen (DE)

(72) Inventors: Markus Schwab, Aalen (DE); Hartmut Enkisch, Aalen (DE); Thomas Schicketanz, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/222,512

(22) Filed: Dec. 17, 2018

(65) Prior Publication Data

US 2019/0121107 A1 Apr. 25, 2019

Related U.S. Application Data

(63) Continuation of application No. PCT/EP2017/065936, filed on Jun. 28, 2017.

(30) Foreign Application Priority Data

Jul. 11, 2016 (DE) .................... 10 2016 212 578

(51) Int. Cl.
  *G03F 7/20* (2006.01)
  *G02B 17/06* (2006.01)
  *G02B 5/08* (2006.01)

(52) U.S. Cl.
  CPC ....... *G02B 17/0663* (2013.01); *G02B 5/0891* (2013.01); *G03F 7/702* (2013.01); *G03F 7/70233* (2013.01); *G03F 7/70958* (2013.01)

(58) Field of Classification Search
  CPC ... G02B 5/0891; G02B 17/0663; G03F 7/702; G03F 7/70233; G03F 7/70958
  (Continued)

(56) References Cited

U.S. PATENT DOCUMENTS 4,964,706 A   10/1990 Cook
2007/0058269 A1   3/2007 Mann et al.
(Continued)

FOREIGN PATENT DOCUMENTS

DE   10 2012 212 753 A1   1/2014
DE   10 2015 209 827 A1   9/2015
WO   WO 2012/126867 A    9/2012

OTHER PUBLICATIONS

International Search Report and Written Opinion for corresponding PCT Appl No. PCT/EP2017/065936, dated Oct. 26, 2017.
(Continued)

*Primary Examiner* — Colin W Kreutzer
(74) *Attorney, Agent, or Firm* — Fish & Richardson P.C.

(57) ABSTRACT

A projection optical unit for EUV projection lithography has a plurality of mirrors for imaging an object field into an image field with illumination light. At least one of the mirrors is an NI mirror and at least one of the mirrors is a GI mirror. A mirror dimension Dx of the at least one NI mirror in a plane of extent (xz) perpendicular to a plane of incidence (yz) satisfies the following relationship:

$4\, LLWx/IWPV_{max} < Dx.$

A mirror dimension Dy of the at least one GI mirror in the plane of incidence (yz) satisfies the following relationship:

$4\, LLWy/(IWPV_{max} \cos(a)) < Dy.$

21 Claims, 12 Drawing Sheets

(58) Field of Classification Search
USPC .............................. 355/61, 66, 67; 359/359
See application file for complete search history.

(56) References Cited

U.S. PATENT DOCUMENTS

| | | | |
|---|---|---|---|
| 2008/0170310 A1* | 7/2008 | Mann | G02B 17/0663 359/839 |
| 2010/0149509 A1 | 6/2010 | Shiraishi et al. | |
| 2013/0088701 A1 | 4/2013 | Mann et al. | |

OTHER PUBLICATIONS

German Examination Report, with translation thereof, for corresponding DE Appl No. 10 2016 212 578.8, dated Mar. 14, 2017.

* cited by examiner

US 10,545,323 B2

PROJECTION OPTICAL UNIT FOR EUV PROJECTION LITHOGRAPHY

CROSS-REFERENCE TO RELATED APPLICATIONS

The present application is a continuation of, and claims benefit under 35 USC 120 to, international application PCT/EP2017/065936, filed Jun. 28, 2017, which claims benefit under 35 USC 119 of German Application No. 10 2016 212 578.8, filed Jul. 11, 2016. The entire disclosure of these applications are incorporated by reference herein.

FIELD

The application relates to a projection optical unit for EUV projection lithography. Further, the application relates to an optical system including such a projection optical unit, a projection exposure apparatus including such an optical system, a method for producing a microstructured or nanostructured component using such a projection exposure apparatus and a microstructured or nanostructured component produced by this method.

BACKGROUND

Projection optical units of the type set forth at the outset are known from DE 10 2015 209 827 A1, from DE 10 2012 212 753 A1, from US 2010/0149509 A1 and from U.S. Pat. No. 4,964,706.

SUMMARY

The present application seeks to develop a projection optical unit such that this results in a projection optical unit which is optimizable, in particular for very short EUV illumination light wavelengths.

In one aspect, the disclosure provides a projection optical unit for EUV projection lithography including a plurality of mirrors for imaging an object field into an image field with illumination light. At least one of the mirrors is embodied as an NI mirror and arranged in such a way that a reflection surface of the NI mirror is impinged upon with a maximum angle of incidence of a chief ray of a central field point. The maximum angle of incidence is less than 45°. A ray portion of the chief ray incident on the reflection surface face and a ray portion of the chief ray emerging from the reflection surface lie in a plane of incidence (yz). A mirror dimension Dx of the at least one NI mirror in a plane of extent (xz) perpendicular to the plane of incidence (yz) satisfies the following relationship:

$$4\, LLWx/IWPV_{max} < Dx,$$

where the following applies:
  LLWx: étendue of the projection optical unit in the plane of extent (xz); and
  $IWPV_{max}$: maximum difference between a maximum angle of incidence and a minimum angle of incidence of the illumination light, respectively at the same location and determined on the entire reflection surface of the NI mirror.

What was recognized according to the application is that, on account of basic theoretical optical considerations, it is not possible to realize an optical design of a projection optical unit which permits reflection coatings for optimization even in the case of very short EUV illumination light wavelengths for as long as certain dimensional relationships are not satisfied for at least individual mirrors of the projection optical unit. In particular, a relationship was identified between a mirror minimum dimension and an angle of incidence bandwidth of the illumination light on the mirror. The dimensional relationship specified for NI mirrors provides a lower bound for an NI mirror dimension perpendicular to the plane of incidence of the illumination light reflected by this mirror. Only if use is made of an NI mirror satisfying this relationship is it possible to find designs which permit a reflection coating of this mirror with a reflection efficiency required for the operation at very short EUV wavelengths. For the at least one NI mirror, a reflectivity which is greater than 60% and, in particular, at least 65% emerges for an EUV used wavelength of 6.7 nm. The specified dimensional relationship may apply to at least one of the NI mirrors of the projection optical unit. The specified dimensional relationship may also apply to a plurality of NI mirrors and, in particular, to all NI mirrors of the projection optical unit.

The maximum difference between a maximum angle of incidence and a minimum angle of incidence of the illumination light on a mirror is determined as follows: For each location on the mirror, the maximum angle of incidence and the minimum angle of incidence of the illumination light is determined at this mirror location. This is carried out for all locations on the mirror. Now, for each location on the mirror, the difference between the maximum angle of incidence and the minimum angle of incidence of the illumination light at this mirror location is formed, i.e. the difference between the respective local maximum angle of incidence and the respective local minimum angle of incidence. The maximum difference between the respective local maximum angle of incidence and the minimum angle of incidence, which is found in this manner, is the maximum angle of incidence difference $IWPV_{max}$. Thus, this value is the maximum of all angle of incidence differences which occur locally on the respective mirror.

In some embodiments, the mirror dimension Dx of the NI mirrors is at least 200 mm. The mirror dimension may be at least 335 mm. The mirror dimension may be greater than 350 mm and may also be greater than 400 mm.

In one aspect, the disclosure provides a projection optical unit for EUV projection lithography including a plurality of mirrors for imaging an object field into an image field with illumination light. At least one of the mirrors is embodied as a GI mirror and arranged in such a way that a reflection surface of the mirror is impinged upon with a maximum angle of incidence of a chief ray of a central field point. The maximum angle of incidence being greater than 45°. A ray portion of the chief ray incident on the reflection surface and a ray portion of the chief ray emerging from the reflection surface lie in a plane of incidence (yz). A mirror dimension Dy of the at least one GI mirror in the plane of incidence (yz) satisfies the following relationship:

$$4\, LLWy/(IWPV\ \max\ \cos(a)) < Dy,$$

where the following applies:
  LLWy: étendue of the projection optical unit in the plane of incidence (yz);
  IWPVmax: maximum difference between a maximum angle of incidence and a minimum angle of incidence of the illumination light on the reflection surface of the GI mirror; and
  a: angle of incidence of a chief ray of the central field point on the reflection surface of the GI mirror.

Corresponding considerations to those discussed above in the summary, which were made above for the dimensional relationship for the at least one NI mirror, also apply to such a projection optical unit including at least one GI mirror.

What was surprisingly recognized here is that the GI mirror dimension, which is important when entering a dimensional minimum size, is not the same mirror dimension perpendicular to the plane of incidence, like in the dimensional relationship discussed above for the NI mirror, but the mirror dimension in the plane of incidence. This discovery emerges from closely considering the light guiding conditions, taking into account the étendue and also the field dimensions of the projection optical unit. For the at least one GI mirror, a reflectivity which is greater than 75%, greater than 80% and, in particular, at least 81% emerges for an EUV used wavelength of 6.7 nm. The GI mirror dimensional relationship may apply to at least one of the GI mirrors, may apply to a plurality of GI mirrors and, in particular, may apply to all GI mirrors of the projection optical unit.

In some embodiments, the mirror dimension Dy of the at least one GI mirror at least 100 mm. The mirror dimension of the GI mirror in the plane of incidence may be at least 150 mm, may be at least 200 mm and may be at least 250 mm and also at least 270 mm. The projection optical unit may be constructed as a combination of NI mirrors and GI mirrors.

In some embodiments, the projection optical unit includes at least one NI mirror and at least one GI mirror according to. Such a projection optical unit unifies the advantages were discussed above in conjunction with satisfying the NI mirror dimensional relationship and the GI mirror dimensional relationship.

In some embodiments, a maximum difference $IWPV_{max}$ between a maximum angle of incidence and a minimum angle of incidence of the illumination light on the reflection surface of the at least one NI mirror in the plane of incidence (yz) is at least 3° and/or at most 10°. In some embodiments, a maximum difference $IWPV_{max}$ between a maximum angle of incidence and a minimum angle of incidence of the illumination light on the reflection surface of the at least one GI mirror in the plane of incidence (yz) is at least 0.25° and/or at most 4°. Such maximum angle of incidence bandwidths were found to be very suitable for realizing a projection optical unit, the mirrors of which may be coated very efficiently, even for very short EUV illumination light wavelengths.

In some embodiments, the projection optical unit is telecentric on the object side. Such an object-side telecentricity leads to an advantageously small angle of incidence bandwidth of the illumination light when impinging the object field, i.e. during the operation of a projection exposure apparatus, the projection optical unit being a constituent thereof, at an object with, in particular, reflecting embodiment, i.e., for example, at a reticle.

In some embodiments, the image field is spanned by a coordinate x perpendicular to a plane of incidence and a coordinate y perpendicular thereto, and an aspect ratio $x_{bf}/y_{bf}$ of the image field is greater than 13. Such an image field aspect ratio was found to be particularly suitable for realizing a projection optical unit, in which the mirrors may be coated in a reflection-optimized manner, even for very short EUV illumination light wavelengths. The x/y aspect ratio may be greater than 15, may be greater than 20, may be 21.67, may be greater than 30, may be greater than 50, may be greater than 80, may be 86.67 and may also be greater than 100. A reduced field dimension in an object displacement direction or scanning direction y may lead to a reduction in an angle of incidence bandwidth, in particular on a GI mirror of the projection optical unit.

In embodiments, the disclosure provides: an optical system including an illumination optical unit for illuminating an object field with light and a projection optical unit described herein; a projection exposure apparatus including such an optical unit and an EUV light source; a method of making a structured component unit using such a projection exposure apparatus; and a microstructured or nanostructured component according to such a method. The advantages associated with such embodiments correspond to those explained above with reference to the projection optical unit according to the application.

The EUV light source of the projection exposure apparatus can be embodied in such a way that a used wavelength emerges which is at most 13.5 nm, which is less than 13.5 nm, which is less than 10 nm, which is less than 8 nm, which is less than 7 nm and which is e.g. 6.7 nm or 6.9 nm. A used wavelength of less than 6.7 nm and, in particular, in the region of 6 nm is also possible.

In particular, a semiconductor component, for example a memory chip, may be produced using the projection exposure apparatus.

BRIEF DESCRIPTION OF THE DRAWINGS

Exemplary embodiments of the application are explained in more detail below on the basis of the drawing, in which.

DETAILED DESCRIPTION OF EXEMPLARY EMBODIMENTS

Figure 1:
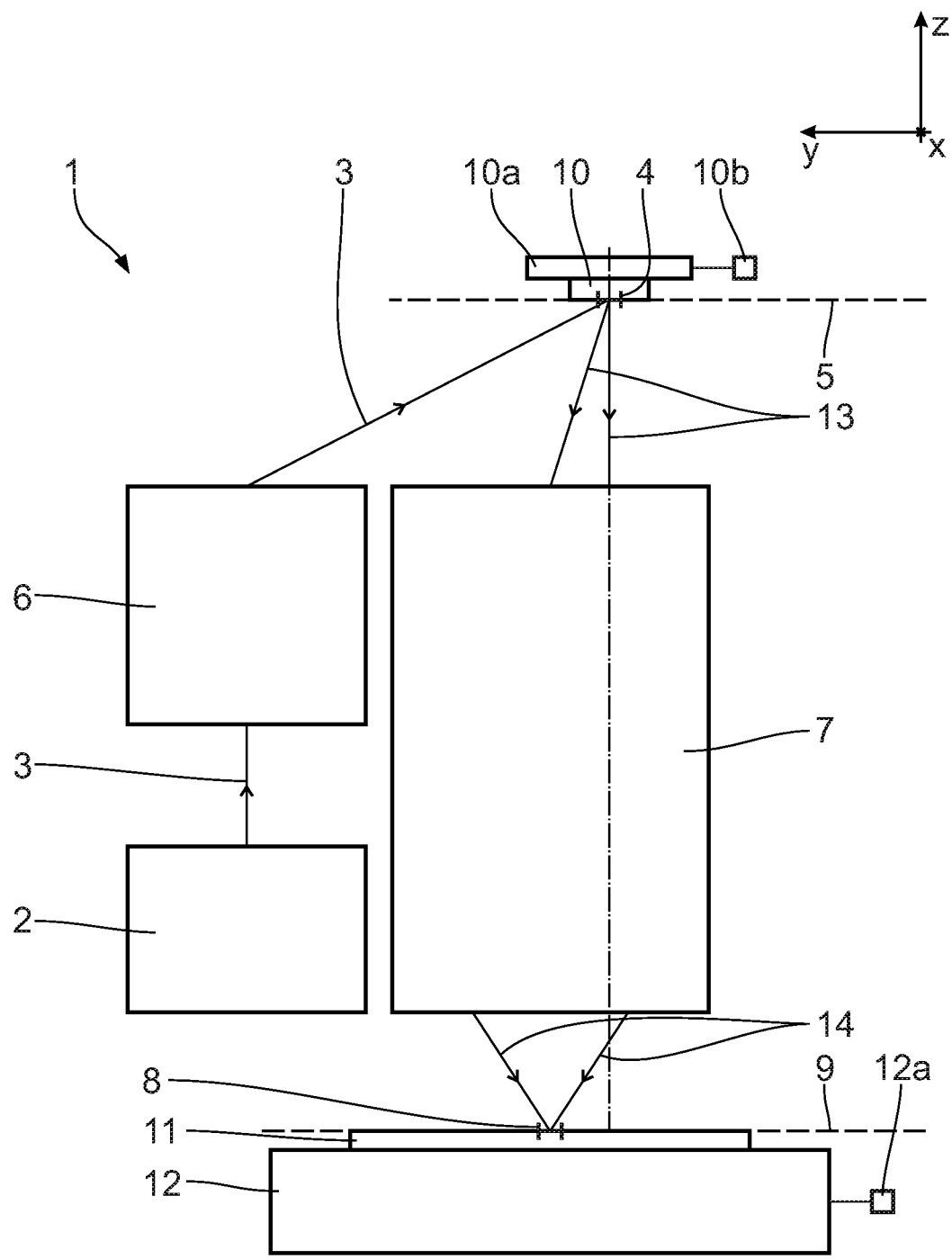
FIG. 1 schematically shows a projection exposure apparatus for EUV microlithography.

A microlithographic projection exposure apparatus 1 has a light source 2 for illumination light or imaging light 3. The light source 2 is an EUV light source, which produces light in a wavelength range of e.g. between 5 nm and 30 nm, in particular between 5 nm and 15 nm. In particular, the light source 2 may be a light source with a wavelength of 13.5 nm or a light source with a wavelength of 6.7 nm or 6.9 nm. Other EUV wavelengths are also possible. In general, even arbitrary wavelengths are possible for the illumination light 3 guided in the projection exposure apparatus 1, for example visible wavelengths or else other wavelengths which may find use in microlithography (for example, DUV, deep ultraviolet) and for which suitable laser light sources and/or LED light sources are available (e.g. 365 nm, 248 nm, 193 nm, 157 nm, 129 nm, 109 nm). A beam path of the illumination light 3 is depicted very schematically in FIG. 1.

An illumination optical unit 6 serves to guide the illumination light 3 from the light source 2 to an object field 4 in an object plane 5. Using a projection optical unit or imaging optical unit 7, the object field 4 is imaged into an image field 8 in an image plane 9 with a predetermined reduction scale. The projection optical unit 7 has exactly one object field 4. The projection optical unit 7 has exactly one image field 8.

In order to facilitate the description of the projection exposure apparatus 1 and the various embodiments of the projection optical unit 7, a Cartesian xyz-coordinate system is indicated in the drawing, from which system the respective positional relationship of the components illustrated in the figures is evident. In FIG. 1, the x-direction runs perpendicular to the plane of the drawing into the latter. The y-direction runs toward the left, and the z-direction runs upward.

The object field 4 and the image field 8 are rectangular. Alternatively, it is also possible for the object field 4 and the image field 8 to have a bent or curved embodiment, that is to say, in particular, a partial ring shape. The object field 4 and the image field 8 have an x/y-aspect ratio of greater than 1 Therefore, the object field 4 has a longer object field dimension in the x-direction and a shorter object field dimension in the y-direction. These object field dimensions extend along the field coordinates x and y.

The projection optical unit 7 is anamorphic, i.e. it has a different reduction scale in the x-direction (reduction scale in the xz-plane) than in the y-direction (reduction scale in the yz-plane). In the x-direction, the projection optical unit 7 has a reduction scale βx of 4.8. In the y-direction, the projection optical unit 7 has a reduction scale βy of −9.6.

Other absolute reduction scales for the reduction in the x-direction and for the reduction in the y-direction are also possible, e.g. 4×, 5×, 6×, 8×, or else reduction scales which are greater than 8×. An embodiment of the projection optical unit 7 with the same reduction scales as these in, firstly, the xz-plane and, secondly, in the yz-plane is also possible.

What is imaged by the projection optical unit 7 is a section of a reflection mask 10, also referred to as reticle, coinciding with the object field 4. The reticle 10 is carried by a reticle holder 10a. The reticle holder 10a is displaced by a reticle displacement drive 10b.

The imaging by way of the projection optical unit 7 is implemented on the surface of a substrate 11 in the form of a wafer, which is carried by a substrate holder 12. The substrate holder 12 is displaced by a wafer or substrate displacement drive 12a.

FIG. 1 schematically illustrates, between the reticle 10 and the projection optical unit 7, a ray beam 13 of the illumination light 3 that enters into said projection optical unit and, between the projection optical unit 7 and the substrate 11, a ray beam 14 of the illumination light 3 that emerges from the projection optical unit 7. An image-field-side numerical aperture (NA) of the projection optical unit 7 is not reproduced to scale in FIG. 1.

The projection exposure apparatus 1 is of the scanner type. Both the reticle 10 and the substrate 11 are scanned in the y-direction during the operation of the projection exposure apparatus 1. A stepper type of the projection exposure apparatus 1, in which a stepwise displacement of the reticle 10 and of the substrate 11 in the y-direction is effected between individual exposures of the substrate 11, is also possible. These displacements are effected synchronously to one another by an appropriate actuation of the displacement drives 10b and 12a.

Figure 2:
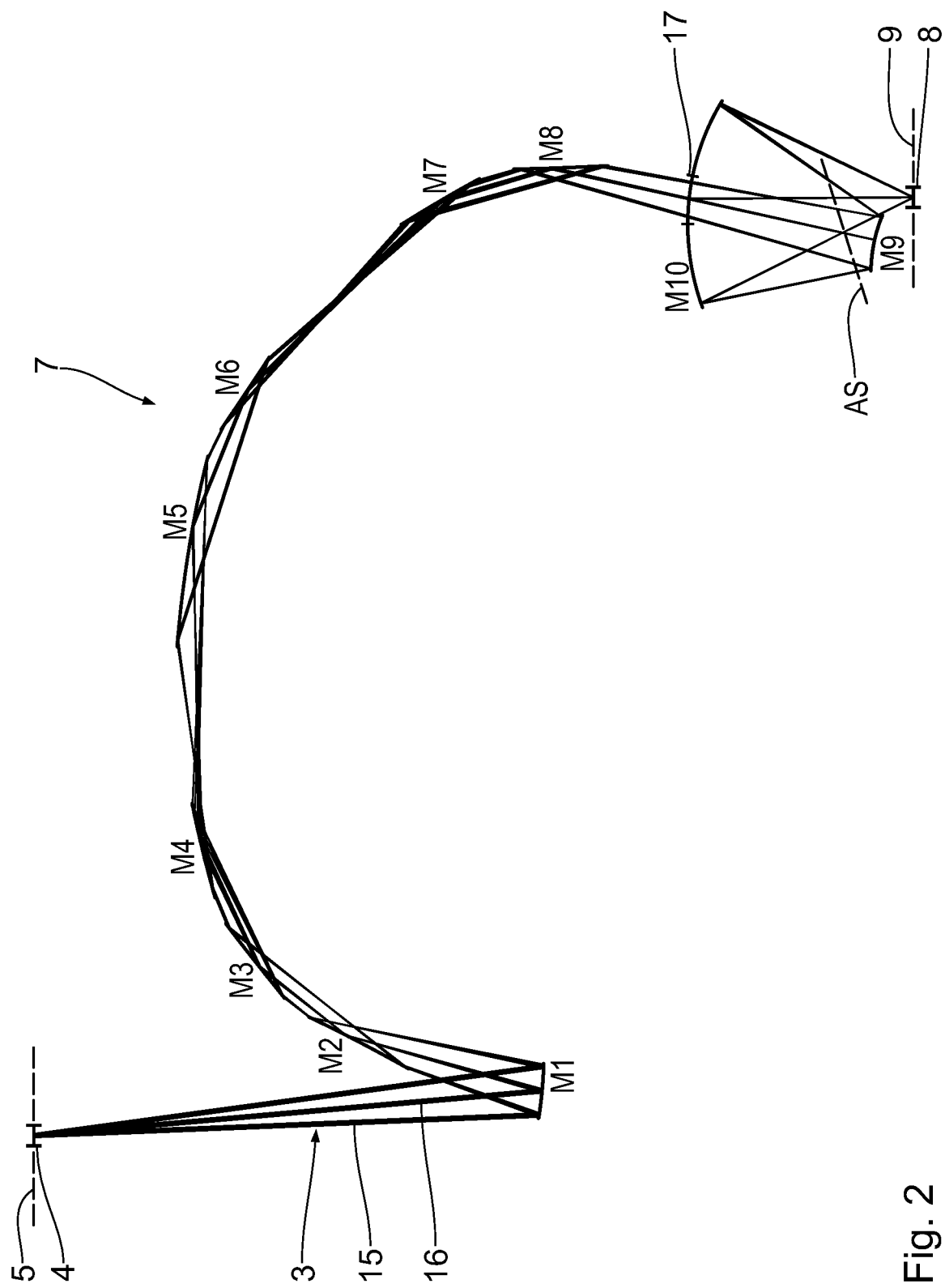
FIG. 2 shows, in a meridional section, an embodiment of an imaging optical unit which can be used as a projection lens in the projection exposure apparatus according to FIG. 1, wherein an imaging beam path for chief rays and for an upper coma ray and a lower coma ray of a plurality of selected field points is depicted.
Figure 3:
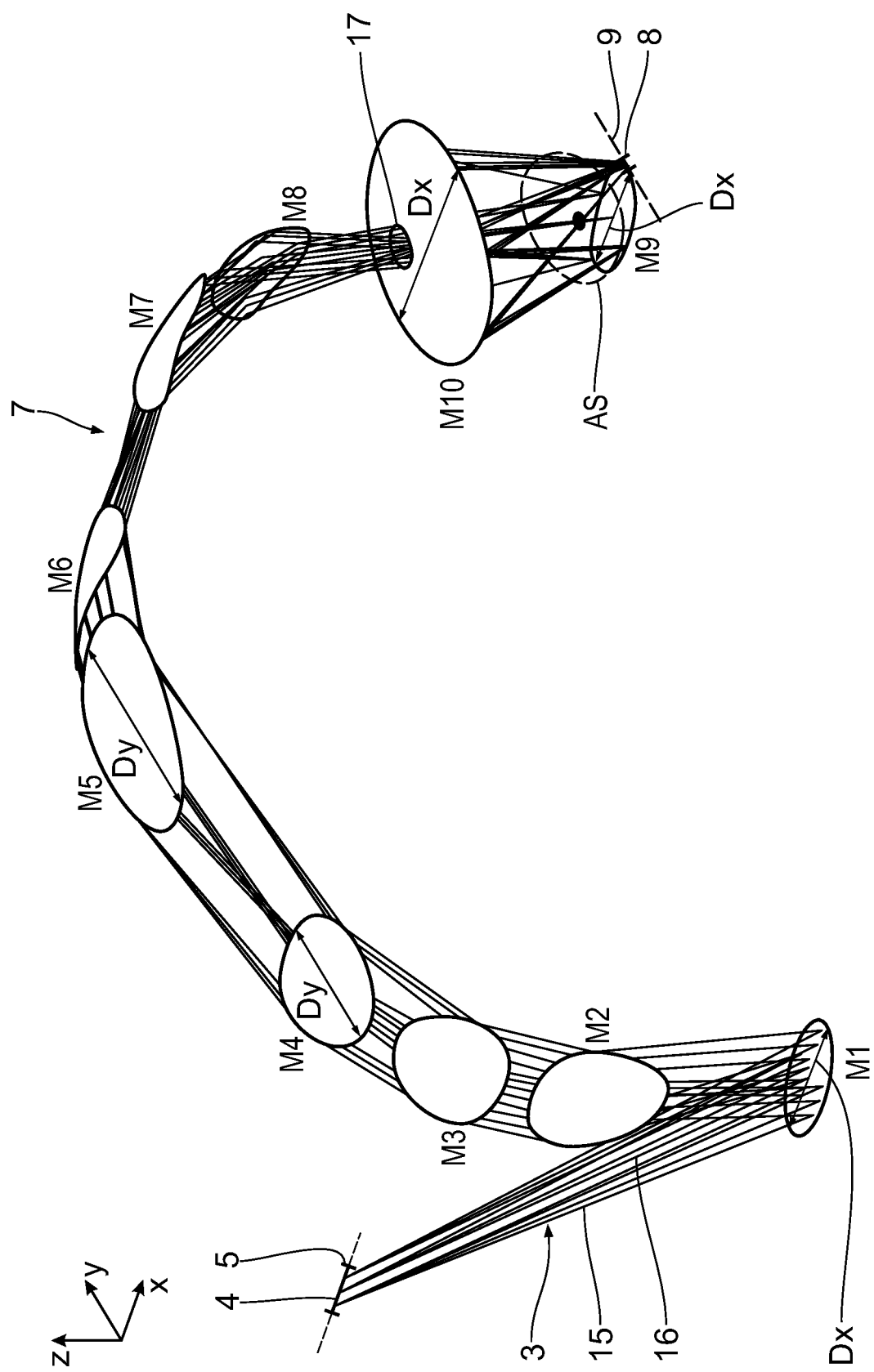
FIG. 3 shows a perspective view of the imaging optical unit according to FIG. 2.
Figure 4A:
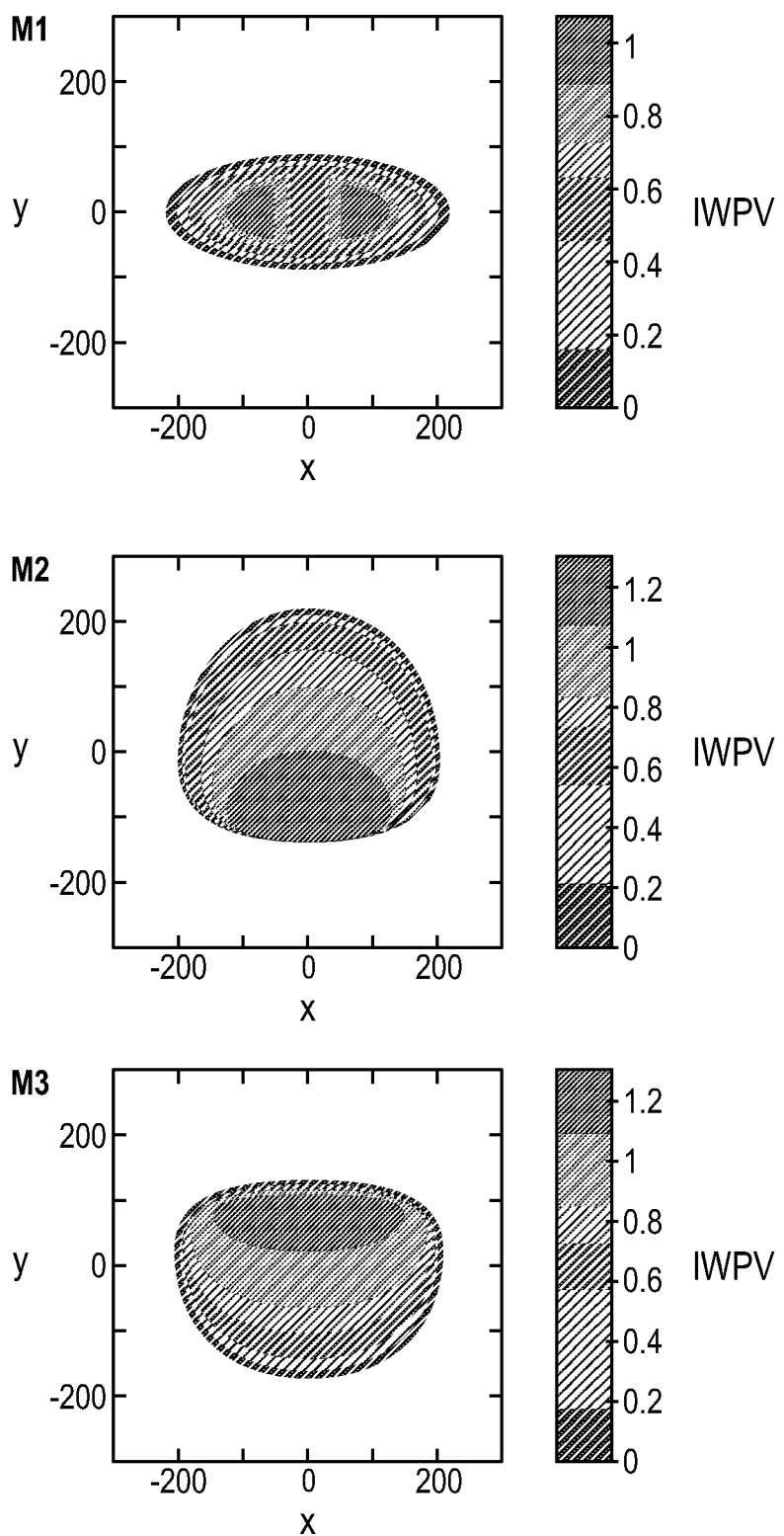
FIGS. 4A to 4D show, in a plan view, edge contours of reflection surfaces respectively impinged by imaging light on the mirrors of the imaging optical unit according to FIG. 2, an edge contour of an imaging light overall beam in a stop plane, and an edge contour of an object field of the imaging optical unit, from which the imaging light rays emanate, wherein, at the same time, an angle of incidence bandwidth of the imaging light on these components or in the arrangement planes thereof is plotted in the edge contours and scaled by way of a value scale depicted in each case next to the edge contour on the right, shown for an image field size of 26 mm×1.2 mm.
Figure 4B:
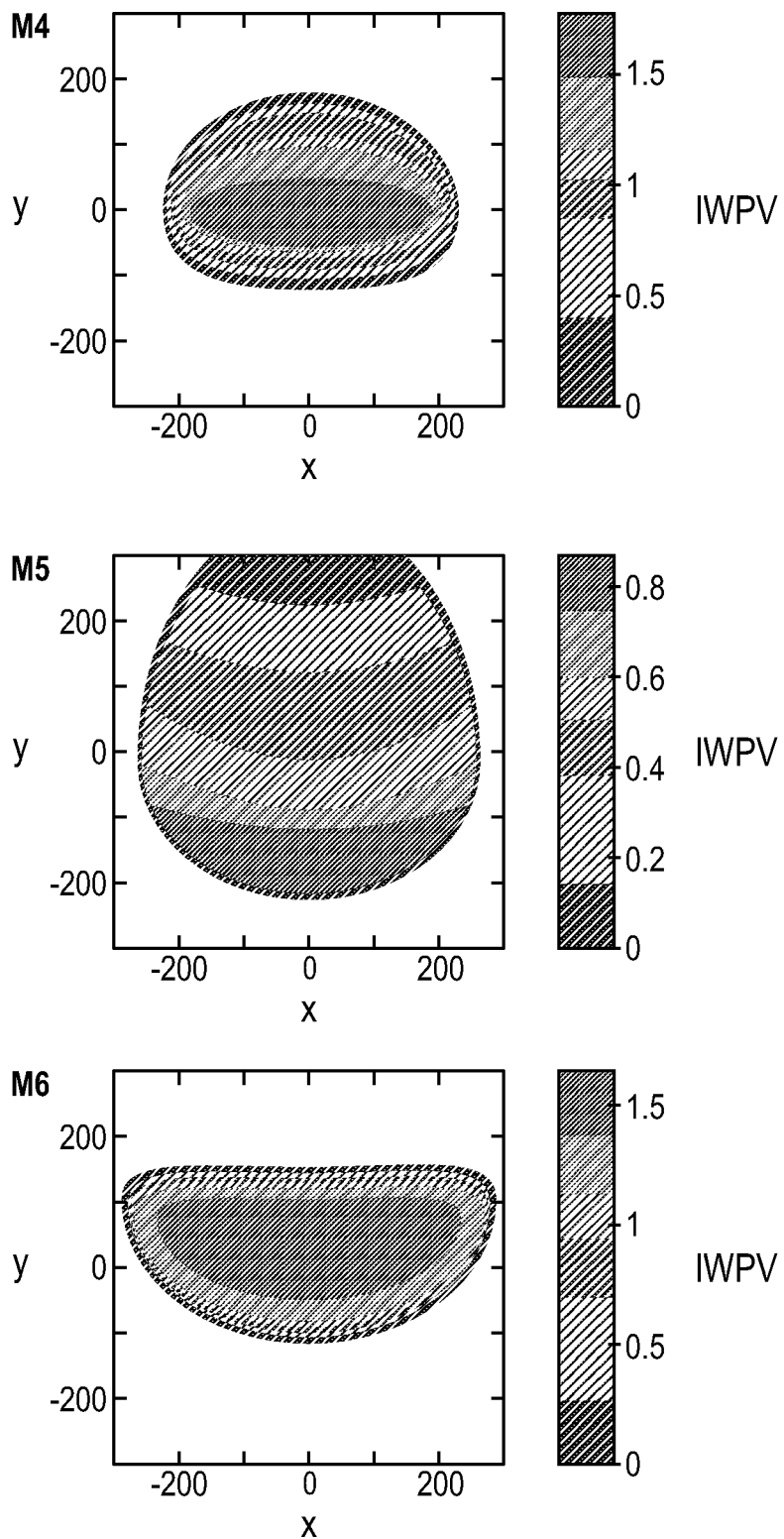
Figure 4C:
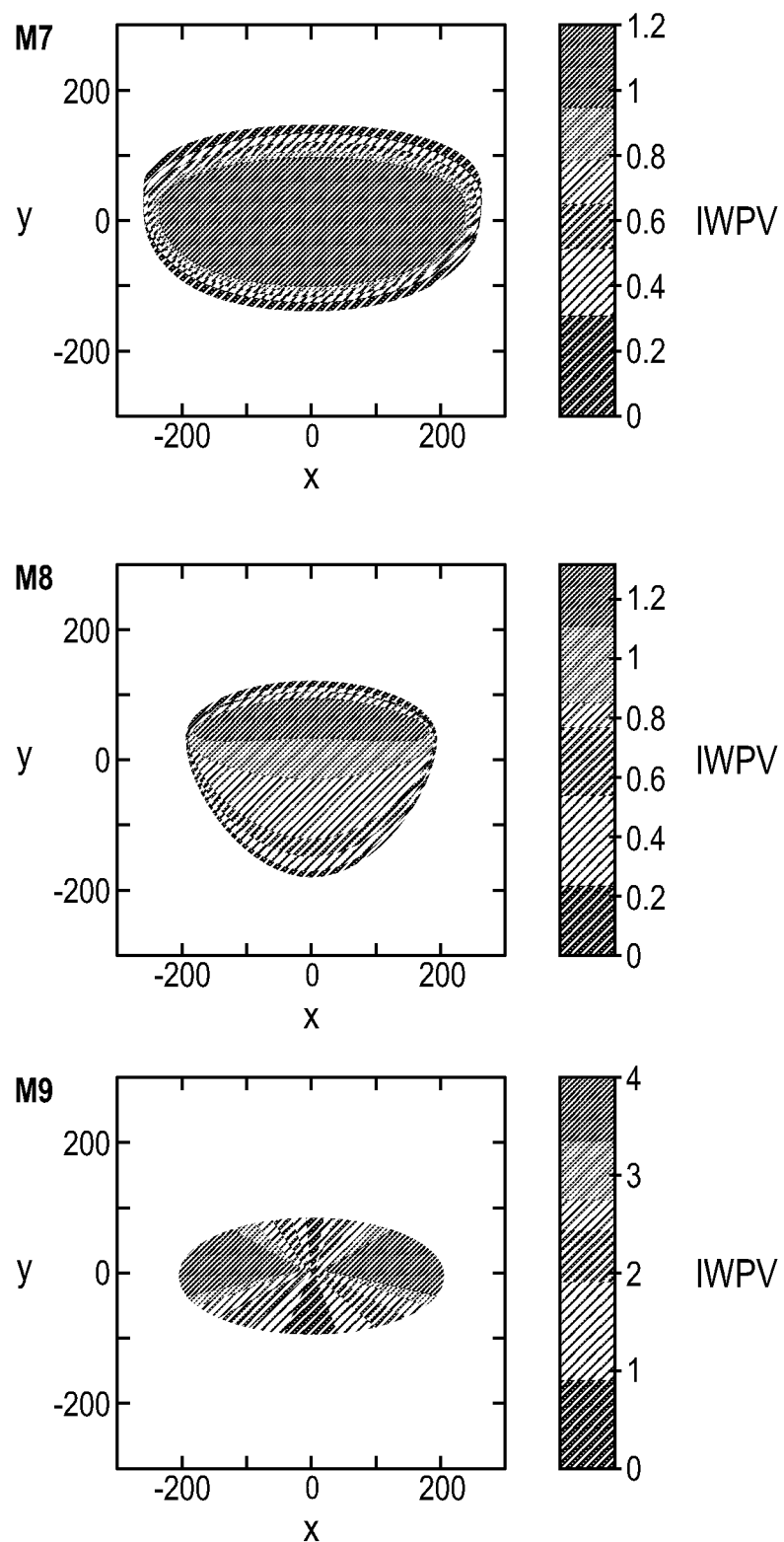
Figure 4D:
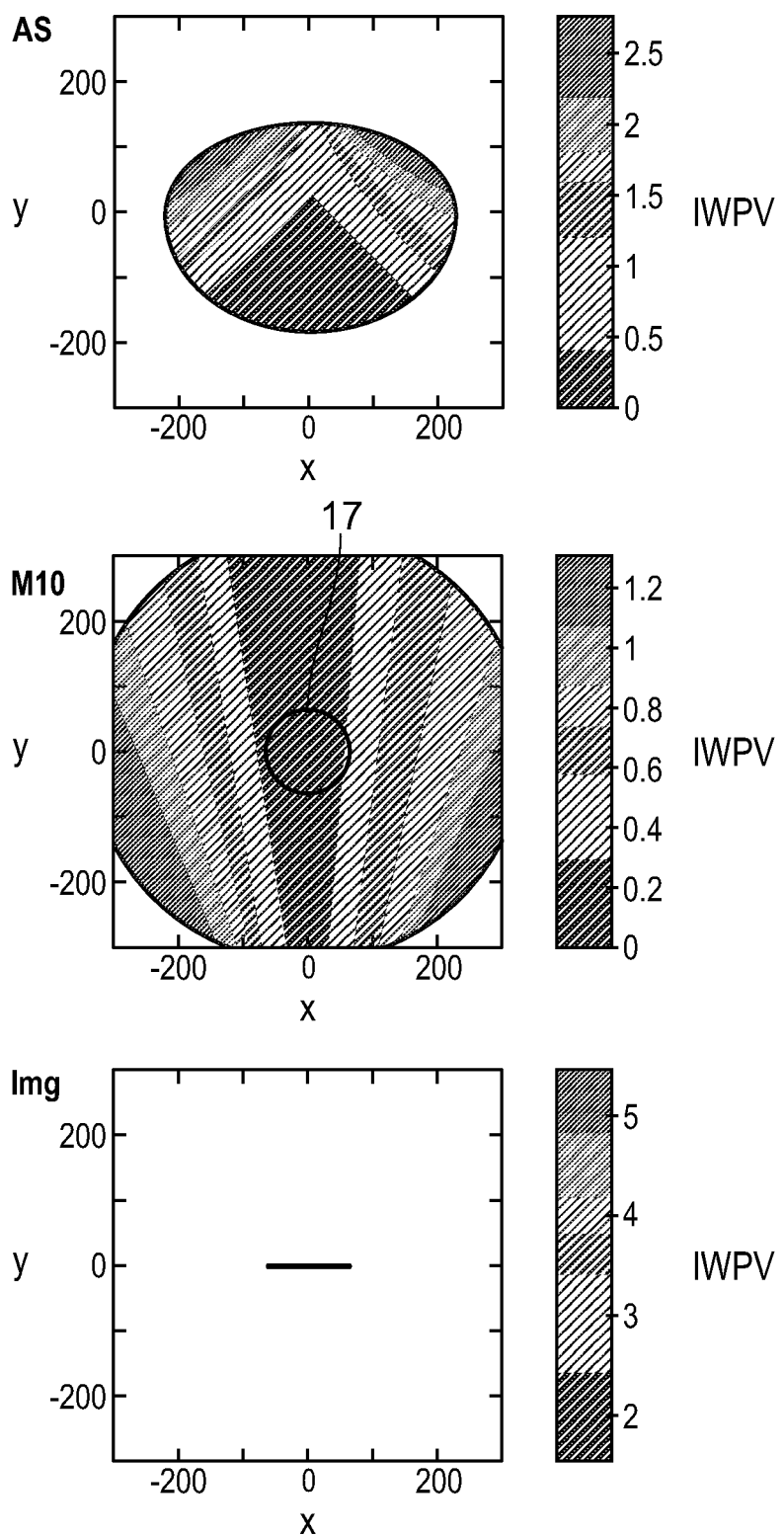
Figure 5A:
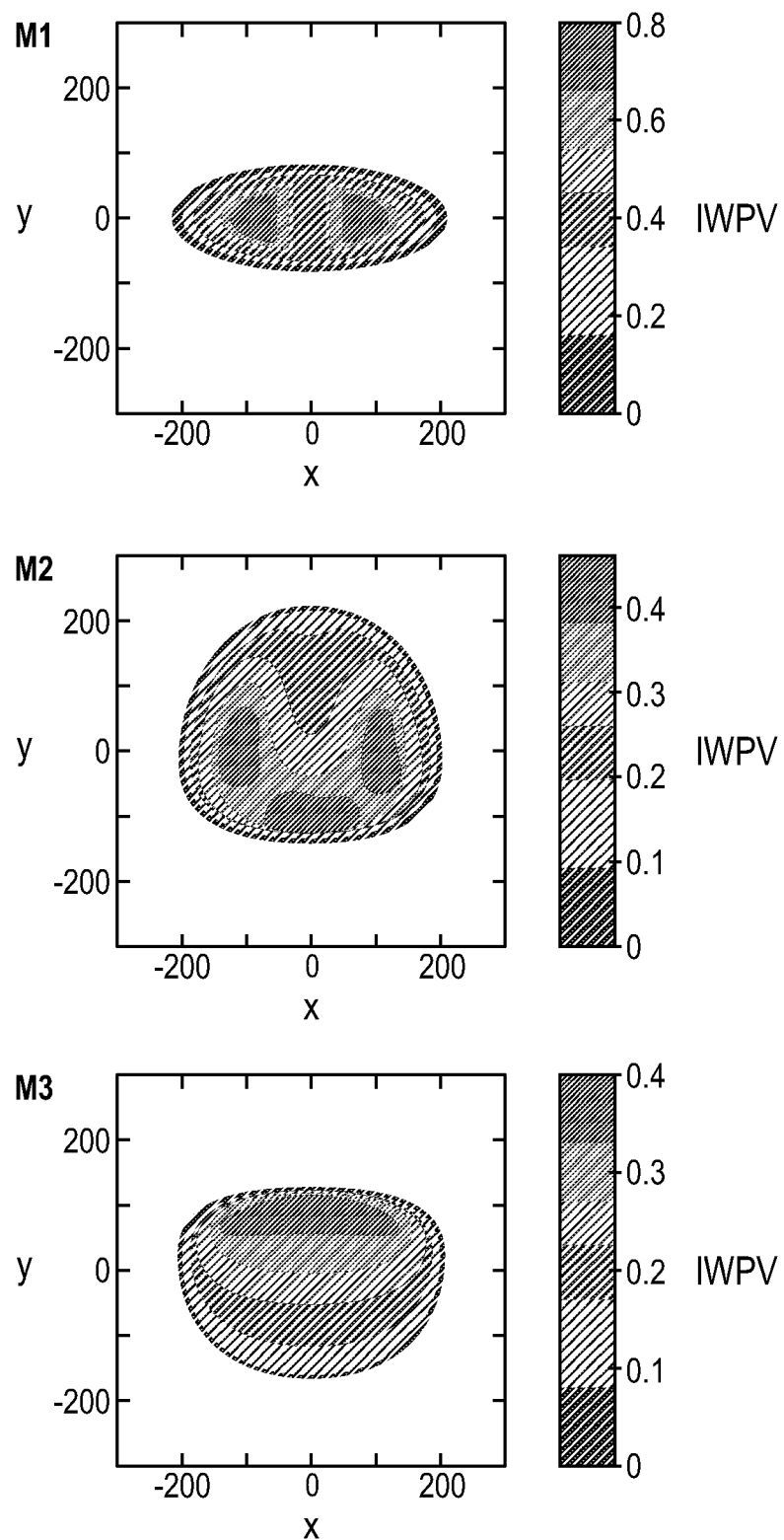
FIGS. 5A to 5D show, in illustrations similar to FIG. 4, the edge contours and the angle of incidence bandwidths present there, shown for an embodiment of the imaging optical unit with an image field size of 26 mm×0.3 mm.
Figure 5B:
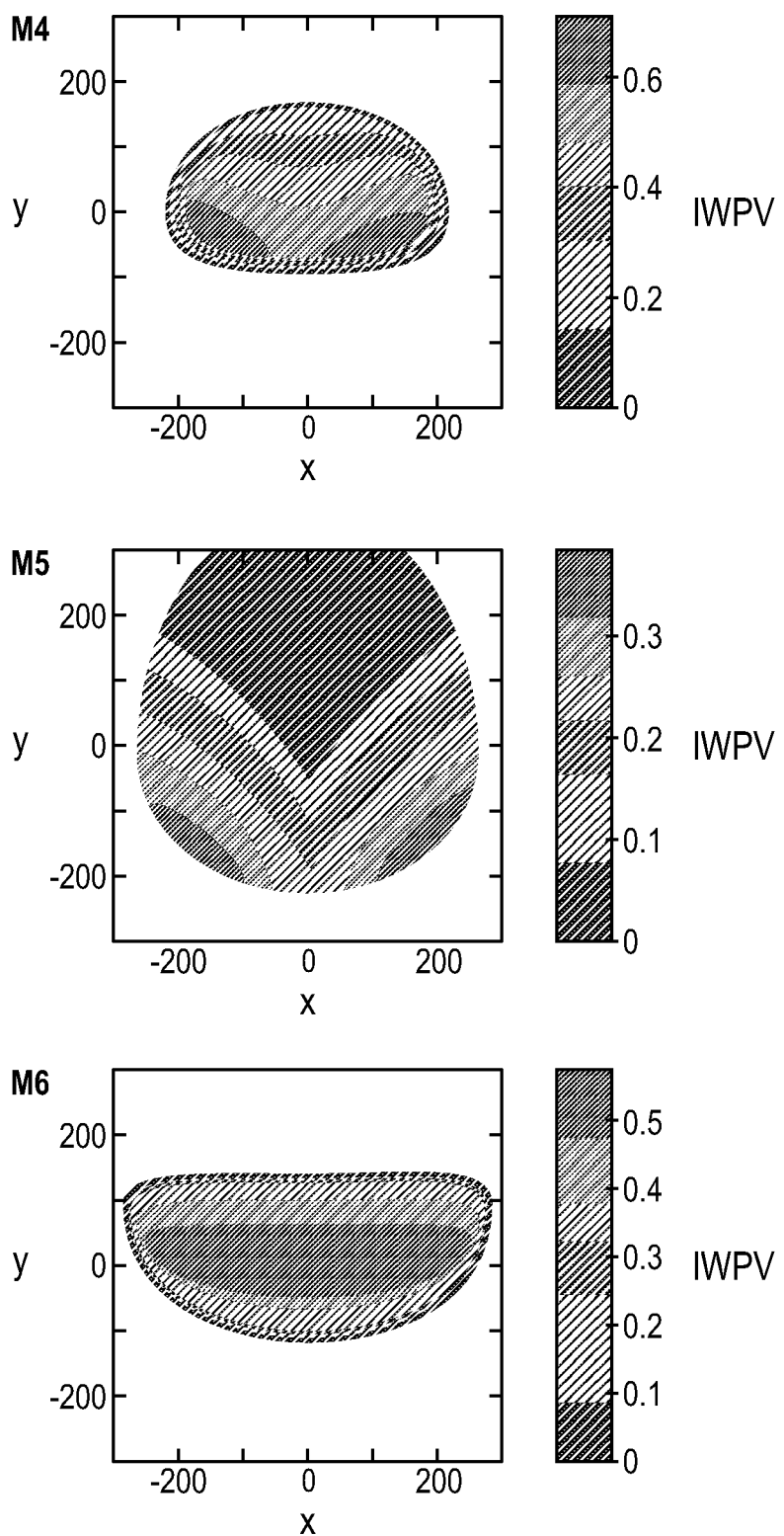
Figure 5C:
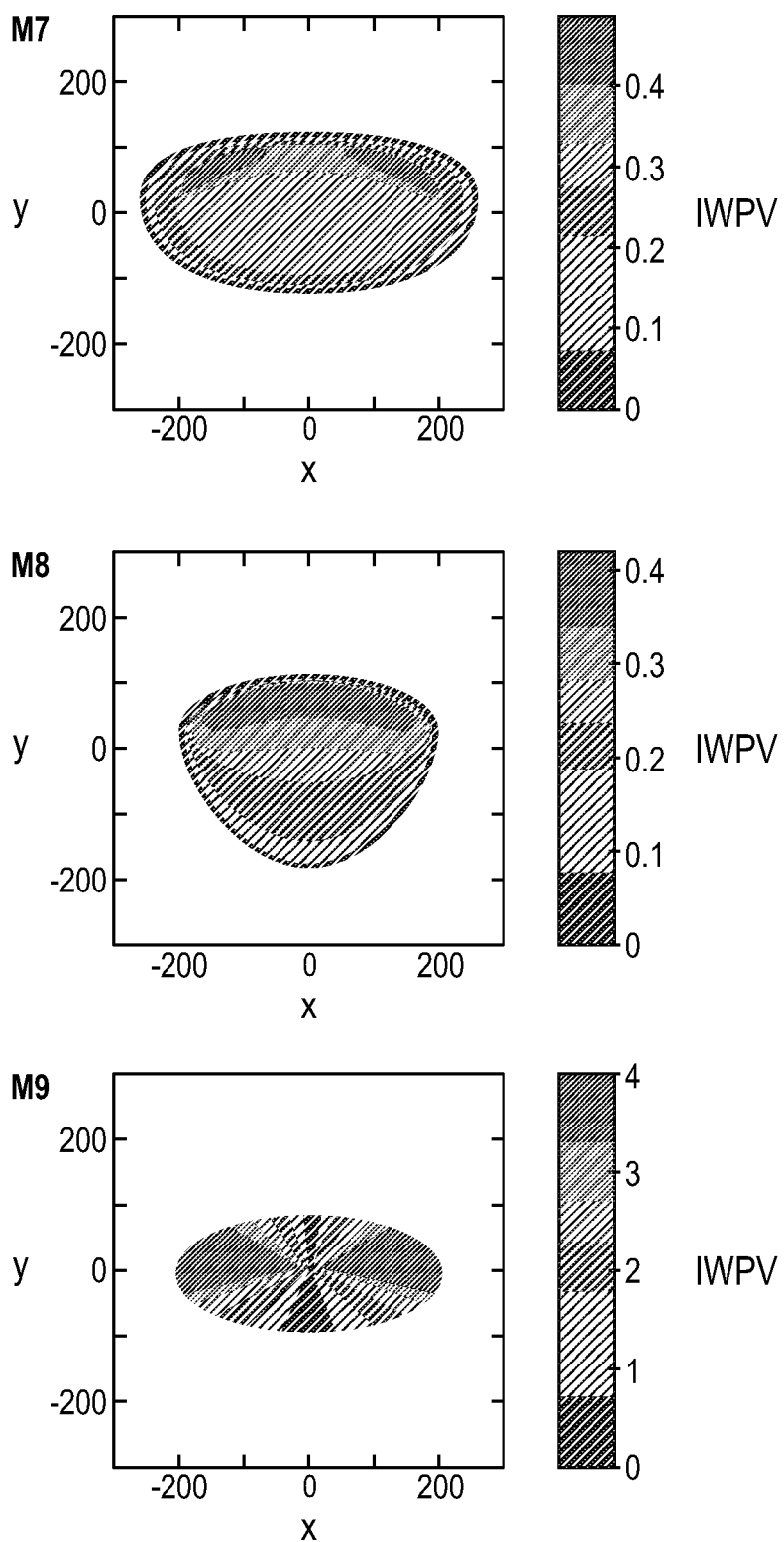
Figure 5D:
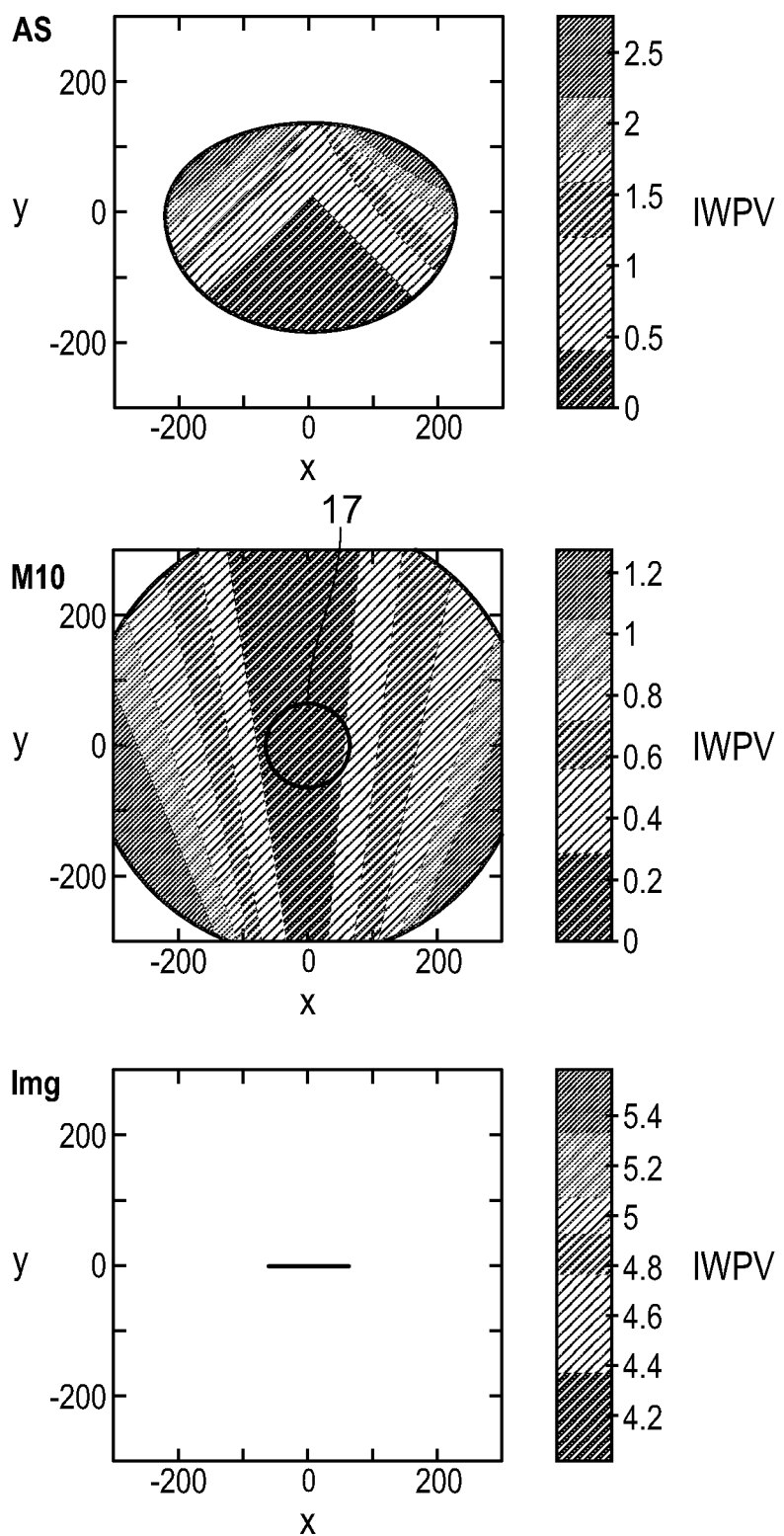

FIGS. 2 and 3 show the optical design of a first embodiment of the projection optical unit 7. FIG. 2 depicts the beam path of in each case three individual rays 15 emanating from a plurality of object field points which are spaced apart from one another in the y-direction in FIG. 2. What is depicted are chief rays 16, i.e. individual rays 15 which pass through the centre of a pupil in a pupil plane of the projection optical unit 7, and in each case an upper coma ray and lower coma ray of these two object field points. Proceeding from the object field 4, the chief ray 16 of a central object field point includes an angle CRAO of 5.0° with a normal of the object plane 5.

The projection optical unit 7 has an image-side numerical aperture NA of 0.45. This numerical aperture has exactly the same size in the xz-plane of incidence on the image field 8 as in the yz-plane of incidence on the image field 8 (NAx=NAy=NA).

The projection optical unit 7 has a total of ten mirrors, which, proceeding from the object field 4, are numbered M1 to M10 in the sequence of the beam path of the individual rays 15. The projection optical unit 7 is a purely catoptric optical unit. The imaging optical unit 7 can also have a different number of mirrors, for example four mirrors, six mirrors or eight mirrors. An odd number of mirrors is also possible in the projection optical unit 7.

FIGS. 2 and 3 depict the calculated reflection surfaces of the mirrors M1 to M10, the edge contours of which are also shown in a plan view in FIGS. 4 and 5. Use is made of a portion of the reflection surfaces which, in fact, are calculated over a larger region. Only this region of the reflection surfaces used in fact for reflecting the imaging light 3 is in fact present in the real mirrors M1 to M10 and, in particular, depicted in FIG. 3. These used reflection surfaces are carried in a known manner by mirror bodies (not shown).

In the projection optical unit 7, the mirrors M1, M9 and M10 are embodied as mirrors for normal incidence, i.e. as mirrors on which the imaging light 3 is incident with an angle of incidence which is less than 45°. Thus, the projection optical unit 7 has a total of three mirrors M1, M9 and M10 for normal incidence. Below, these mirrors are also referred to as NI mirrors. The maximum angle of incidence, which is incident on the respective NI mirror, may be less than 40°, may be less than 35°, may be less than 30°, may be less than 25°, may be less than 20°, may be less than 15° and may also be less than 10°.

The mirrors M2 to M8 are mirrors for grazing incidence of the illumination light 3, that is to say mirrors onto which the illumination light 3 impinges with angles of incidence that are greater than 45°. A typical angle of incidence of the individual rays 15 of the imaging light 3 on the mirrors M2 to M8 for grazing incidence lies in the region of 80°. Overall, the projection optical unit 7 according to FIG. 2 has exactly seven mirrors M2 to M8 for grazing incidence. Below, these mirrors are also referred to as GI mirrors. The minimum angle of incidence, which is incident on the respective GI mirror, may be greater than 50°, may be greater than 55°, may be greater than 60°, may be greater than 65°, may be greater than 70°, may be greater than 75° and may also be greater than 80°.

A different number distribution in relation to NI mirrors and GI mirrors is also possible in embodiments of the projection optical unit not depicted here. Configurations in which the projection optical unit only has NI mirrors and also those in which the projection optical unit only has GI mirrors are possible. In between these limit cases, all conceivable number distributions of NI and GI mirrors are possible for a given overall mirror number. Thus, in the case of a projection optical unit with N mirrors, the NI mirrors may number between 0 and N and, correspondingly, the GI mirrors may number between N and 0.

The mirrors M2 to M8 of the projection optical unit 7 reflect the imaging light 3 in such a way that the angles of reflection of the individual rays 15 add up at the respective mirrors M2 to M8.

The mirrors M1 to M10 carry a coating optimizing the reflectivity of the mirrors M1 to M10 for the imaging light 3. For the GI mirrors in particular, this may be a lanthanum coating, a boron coating or a boron coating with an uppermost layer of lanthanum. Other coating materials may also be used, in particular lanthanum nitride and/or $B_4C$. In the mirrors M2 to M8 for grazing incidence, use can be made of a coating with e.g. one ply of boron or lanthanum. The highly reflecting layers, in particular of the mirrors M1, M9 and M10 for normal incidence, can be configured as multi-ply layers, wherein successive layers can be manufactured from different materials. Alternating material layers can also be used. A typical multi-ply layer can have fifty bilayers, respectively made of a layer of boron and a layer of lanthanum. Layers containing lanthanum nitride and/or boron, in particular $B_4C$, may also be used.

Information in respect of the reflection at a GI mirror (mirror for grazing incidence) can be found in WO 2012/126867 A. Further information in respect of the reflectivity of NI mirrors (normal incidence mirrors) can be found in DE 101 55 711 A.

An overall reflectivity or system transmission of the projection optical unit 7, emerging as a product of the reflectivities of all mirrors M1 to M10 of the projection optical unit 7, is approximately R=2.0%.

The mirror M10, that is to say the last mirror upstream of the image field 8 in the imaging beam path, has a passage opening 17 for the passage of the imaging light 3 which is reflected from the antepenultimate mirror M8 toward the penultimate mirror M9. The mirror M10 is used in a reflective manner around the passage opening 17. None of the other mirrors M1 to M9 have passage openings and said mirrors are used in a reflective manner in a continuous region without gaps.

The mirrors M1 to M10 are embodied as free-form surfaces which cannot be described by a rotationally symmetric function. Other embodiments of the projection optical unit 7, in which at least one of the mirrors M1 to M10 is embodied as a rotationally symmetric asphere, are also possible. It is also possible for all mirrors M1 to M10 to be embodied as such aspheres.

A free-form surface can be described by the following free-form surface equation (equation 1):

$$Z = \frac{c_x x^2 + c_y y^2}{1 + \sqrt{1 - (1+k_x)(c_x x)^2 - (1+k_y)(c_y y)^2}} + \quad (1)$$

-continued
$$C_1 x + C_2 y + C_3 x^2 + C_4 xy + C_5 y^2 + C_6 x^3 + \ldots + \\ C_9 y^3 + C_{10} x^4 + \ldots + C_{12} x^2 y^2 + \ldots + C_{14} y^4 + C_{15} x^5 + \\ \ldots + C_{20} y^5 + C_{21} x^6 + \ldots + C_{24} x^3 y^3 + \ldots + C_{27} y^6 + \ldots$$

The following applies to the parameters of this equation (1):

Z is the sag of the free-form surface at the point x, y, where $x^2+y^2=r^2$. Here, r is the distance from the reference axis of the free-form equation (x=0; y=0).

In the free-form surface equation (1), $C_1$, $C_2$, $C_3$ . . . denote the coefficients of the free-form surface series expansion in powers of x and y.

In the case of a conical base area, $c_x$, $c_y$ is a constant corresponding to the vertex curvature of a corresponding asphere. Thus, $c_x=1/R_x$ and $c_y=1/R_y$ applies. Here, $k_x$ and $k_y$ each correspond to a conical constant of a corresponding asphere. Thus, equation (1) describes a biconical free-form surface.

An alternative possible free-form surface can be generated from a rotationally symmetric reference surface. Such free-form surfaces for reflection surfaces of the mirrors of projection optical units of microlithographic projection exposure apparatuses are known from US 2007 0 058 269 A1.

Alternatively, free-form surfaces can also be described with the aid of two-dimensional spline surfaces. Examples for this are Bezier curves or non-uniform rational basis splines (NURBS). By way of example, two-dimensional spline surfaces can be described by a grid of points in an xy-plane and associated z-values, or by these points and gradients associated therewith. Depending on the respective type of the spline surface, the complete surface is obtained by interpolation between the grid points using for example polynomials or functions which have specific properties in respect of the continuity and the differentiability thereof. Examples for this are analytical functions.

FIGS. 4 and 5 show edge contours of the reflection surfaces in each case impinged upon by the imaging light 3 on the mirrors M1 to M10 of the projection optical unit 7, i.e. the so-called footprints of the mirrors M1 to M10. These edge contours are in each case depicted in an x/y-diagram, which corresponds to the local x- and y-coordinates of the respective mirror M1 to M10. The illustrations are true to scale in millimetres. Moreover, the form of the passage opening 17 is depicted in the illustration relating to the mirror M10.

Moreover, FIGS. 4 and 5 also reproduce the edge contour of an aperture stop AS and the edge contour of the respectively used image field 8. In the embodiment according to FIG. 4, the image field has an x/y-extent of 26 mm/1.2 mm (larger image field). In the embodiment according to FIG. 5, the image field 8 has an x/y-extent of 26 mm/0.3 mm (smaller image field).

With reference to the scale depicted next to and to the right of the edge contours in each case, FIGS. 4 (4A to 4D) and 5 (5A to 5D) moreover still depict an angle of incidence bandwidth IWPV. Thus, what emerges from FIGS. 4 and 5 for the large image field and for the small image field is what difference IWPV between a maximum angle of incidence and a minimum angle of incidence of the illumination light 3, which impinges upon this location, is present at which location on the mirrors M1 to M10, when passing through the aperture stop AS and on the object field 8. A maximum difference $IWPV_{max}$ can be determined at exactly one point on the mirror surface considered in each case from the differences IWPV on the reflection surface of one of the mirrors M1 to M10 in each case, on the aperture stop AS and on the object field 8. In the case of the projection optical unit 7, $IWPV_{max}=4°$ applies to the extent that the NI mirrors are considered and $IWPV_{max}=1.8°$ applies to the extent that the GI mirrors are considered. An angle of incidence bandwidth of the illumination light 3 onto the image field 8 is practically constant over the entire image field 8, both in the embodiment according to FIG. 4 and in the embodiment according to FIG. 5, and emerges from the image-side numerical aperture.

Below, details are explained with reference to using the projection optical unit 7 with the larger image field 8. The use of the smaller image field 8 then emerges by a correspondingly reduced illumination of the object field 4.

The two following tables summarize the parameters "maximum angle of incidence", "extent of the reflection surface in the x-direction", "extent of the reflection surface in the y-direction" and "maximum mirror diameter" for the mirrors M1 to M10 of the projection optical unit 7 with the larger image field 8.

|  | M1 | M2 | M3 | M4 | M5 |
|---|---|---|---|---|---|
| Maximum angle of incidence [°] | 11.6 | 81.2 | 78.0 | 82.9 | 78.7 |
| Extent of the reflection surface Dx in the x-direction [mm] | 434.3 | 410.6 | 411.6 | 443.6 | 528.3 |
| Extent of the reflection surface Dy in the y-direction [mm] | 169.7 | 360.7 | 302.5 | 307.4 | 616.6 |
| Maximum mirror diameter [mm] | 434.3 | 425.7 | 412.0 | 445.3 | 623.2 |

|  | M6 | M7 | M8 | M9 | M10 |
|---|---|---|---|---|---|
| Maximum angle of incidence [°] | 82.4 | 78.0 | 77.4 | 18.0 | 9.7 |
| Extent of the reflection surface Dx in the x-direction [mm] | 572.8 | 529.7 | 396.7 | 401.4 | 693.1 |
| Extent of the reflection surface Dy in the y-direction [mm] | 274.7 | 285.5 | 298.2 | 174.5 | 663.2 |
| Maximum mirror diameter [mm] | 573.6 | 530.5 | 397.9 | 401.4 | 693.2 |

The image-side numerical aperture-predetermining mirror M10 has the largest maximum mirror diameter, with a diameter of 693.2 mm. None of the other mirrors M1 to M9 has a maximum diameter which is greater than 625 mm. Six of the ten mirrors, namely the mirrors M1 to M4, M8 and M9, have a maximum mirror diameter which is less than 450 mm.

The largest angle of incidence on the NI mirrors is present on the mirror M9 and is 18.0°. The largest angle of incidence on the GI mirrors is present on the mirror M4 and is 82.9°.

The mirror dimensions Dx of the NI mirrors M1, M9 and M10, i.e. the extent of the reflection surface thereof in the x-direction, satisfy the following relationship:

$$4 \, LLWx/IWPV_{max} < Dx \quad (2)$$

Here:
LLWx: Étendue of the projection optical unit 7 in the xz-plane, i.e. the plane of extent corresponding to the mirror dimension Dx.

The following holds true: $LLWx=NAx \cdot x_{bf}/2$. Thus, the étendue LLWx is the product of the numerical aperture NAx in the plane of extent xz and half of the extent of the image field $x_{bf}$ in the x-direction. The following applies to the projection optical unit 7: LLWx=5.85 mm.

$IWPV_{max}$ is the maximum angle of incidence bandwidth on the respective NI mirror M1, M9 and M10. This maximum angle of incidence bandwidth $IWPV_{max}$ is present on the mirror M9 and is 4°, i.e. 0.698 rad, there. For the relationship (2) this yields:

$$335 \, \text{mm} < Dx$$

Thus, the extents Dx for the NI mirrors must all be greater than 335 mm, which is satisfied for the projection optical unit 7.

For the GI mirrors M2 to M8, the following relationship applies in respect of the mirror dimension Dy in the plane of incidence yz:

$$4 \, LLWy/(IWPV_{max} \cos(a)) < Dy \quad (3)$$

Here:
LLWy: Étendue of the projection optical unit 7 in the plane of incidence yz. a is the folding angle of the respective GI mirror. This folding angle a corresponds to the angle of incidence of a chief ray of a central field point on the GI mirror.

The following applies to the projection optical unit 7 with the y-extent $y_{bf}$ of the image field 8 of 1.2 mm: $LLWy=NAy \cdot y_{bf}/2=0.27$ mm.

$IWPV_{max}$ is the largest angle of incidence bandwidth on one of the GI mirrors M2 to M8. This greatest angle of incidence bandwidth is present on the GI mirror M4 and is 1.8°=0.0314 rad.

In the case of a folding angle a of 75° and a maximum angle of incidence bandwidth $IWPV_{max}$ of 0.0314 rad, the following emerges by insertion into relationship (3) above:

$$133 \, \text{mm} < Dy.$$

Thus, all GI mirrors must have a Dy extent which is greater than 133 mm, which is satisfied for the GI mirrors of the projection optical unit 7.

If an angle of incidence bandwidth of $IWPV_{max}$ 1.0° is assumed with otherwise unchanged parameters, this yields a lower limit for the Dy extent of 240 mm.

Satisfying the relationship also applies for the use of an image field with a small y-extent $y_{bf}$=0.3 mm. In this case, the GI mirrors have a maximum angle of incidence bandwidth of approximately 1°=0.0174 rad (cf. GI mirror M4 in FIG. 5). Étendue LLWy then is 0.0675 mm With a=83°, inserting these values into Equation (3) above leads to a lower bound for the extent Dy of 127 mm, which is likewise satisfied in the case of the GI mirrors of the projection optical unit.

Figure 6:
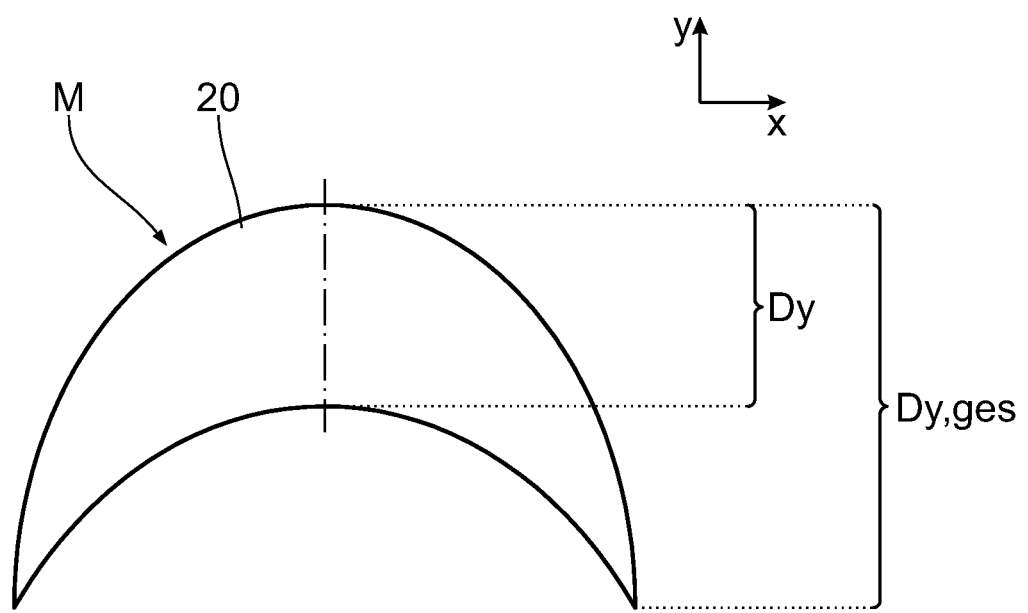
FIG. 6 schematically shows a plan view of a reflection surface of a GI mirror (mirror for grazing incidence) of a further embodiment of an imaging optical unit, which is usable as a projection lens in the projection exposure apparatus according to FIG. 1, for elucidating a definition of a mirror dimension Dy.

On the basis of FIG. 6, there still is a clarifying definition for the extent Dy of a reflection surface 20 of a mirror M, which has a sickle-shaped, symmetrically curved embodiment. Dy denotes an extent of the reflection surface in a meridional plane of the mirror M, i.e. at x=0. This extent of the reflection surface Dy is less than a y-extent of the reflection surface Dy,ges, as seen over the entire mirror M. Dy should be inserted into the above relationship (3), and not Dy,ges.

Corresponding tables for the mirror dimensions emerge for the projection optical unit 7 with the small image field with x/y-dimensions of 26 mm/0.3 mm:

|                                                      | M1    | M2    | M3    | M4    | M5    |
|------------------------------------------------------|-------|-------|-------|-------|-------|
| Maximum angle of incidence [°]                       | 11.4  | 80.9  | 77.5  | 82.8  | 78.5  |
| Minimum angle of incidence                           | 9.7   | 76.5  | 75.5  | 76.0  | 77.1  |
| Extent of the reflection surface Dx in the x-direction [mm] | 434.9 | 411.4 | 412.1 | 442.8 | 527.2 |
| Extent of the reflection surface Dy in the y-direction [mm] | 162.3 | 350.6 | 289.5 | 265.1 | 603.6 |
| Maximum mirror diameter [mm]                         | 435.0 | 422.4 | 412.2 | 443.0 | 611.0 |

|                                                      | M6    | M7    | M8    | M9    | M10   |
|------------------------------------------------------|-------|-------|-------|-------|-------|
| Maximum angle of incidence [°]                       | 82.1  | 77.8  | 77.1  | 17.9  | 9.6   |
| Minimum angle of incidence                           | 74.3  | 73.7  | 73.6  | 0.0   | 4.6   |
| Extent of the reflection surface Dx in the x-direction [mm] | 572.8 | 529.7 | 392.8 | 400.8 | 692.9 |
| Extent of the reflection surface Dy in the y-direction [mm] | 258.2 | 252.1 | 280.3 | 174.8 | 662.5 |
| Maximum mirror diameter [mm]                         | 573.1 | 529.7 | 392.9 | 401.0 | 693.5 |

In the projection optical unit with the small image field (26 mm×0.3 mm), the mirror dimensions Dy tend to be slightly smaller than in the projection optical unit with the large image field.

The optical design data of the reflection surfaces of the mirrors M1 to M10 of the projection optical unit 7 can be gathered from the following tables. These optical design data in each case proceed from the image plane 9, i.e. describe the respective projection optical unit in the reverse propagation direction of the imaging light 3 between the image plane 9 and the object plane 5.

The first of these tables provides an overview of the design data of the projection optical unit 7 and summarizes the numerical aperture NA, the calculated design wavelength for the imaging light, the dimensions of the image field in the x-direction and y-direction, image field curvature and stop locations. This curvature is defined as the inverse radius of curvature of the field.

The image field 8 has an x-extent of two times 13 mm and a y-extent of 1.2 mm. The projection optical unit 7 is optimized for an operating wavelength of the illumination light 3 of 6.7 nm.

The second of these tables provides vertex point radii (Radius_x=$R_x$, Radius_y=$R_y$) and refractive power values (Power_x, Power_y) for the optical surfaces of the optical components. Negative values of radius mean curves which are concave toward the incident illumination light 3 in the section of the respective surface with the considered plane (xz, yz), which is spanned by a surface normal at the vertex point with the respective direction of curvature (x, y). The two radii Radius_x, Radius_y may explicitly have different signs.

The vertex points at each optical surface are defined as points of incidence of a guide ray which travels from an object field centre to the image field 8 along a plane of symmetry x=0, i.e. the plane of the drawing of FIG. 2 (meridional plane).

The refractive powers Power_x ($P_x$), Power_y ($P_y$) at the vertex points are defined as:

$$P_x = -\frac{2\cos AOI}{R_x}$$

$$P_y = -\frac{2}{R_y \cos AOI}$$

Here, AOI denotes an angle of incidence of the guide ray with respect to the surface normal.

The third table specifies, for the mirrors M1 to M10, in millimetres, the conic constants $k_x$ and $k_y$, the vertex point radius $R_x$ (=Radius_x) and the free-form surface coefficients $C_n$. Coefficients $C_n$ not tabulated in the table each have a value of 0.

The fourth table still specifies the magnitude along which the respective mirror, proceeding from a reference surface, was decentred (DCY) in the y-direction, and displaced (DCZ) and tilted (TLA, TLB, TLC) in the z-direction. This corresponds to a parallel shift and a tilting in the case of the freeform surface design method. Here, a displacement is carried out in the y-direction and in the z-direction in mm, and tilting is carried out about the x-axis, about the y-axis and about the z-axis. In this case, the angle of rotation is specified in degrees. Decentring is carried out first, followed by tilting. The reference surface during decentring is in each case the first surface of the specified optical design data. Decentring in the y-direction and in the z-direction in the object plane 5 is also specified for the object field 4. In addition to the surfaces assigned to the individual mirrors, the fourth table also tabulates the image plane as the first surface, the object plane as the last surface and a stop surface (with the stop label "AS").

The fifth table specifies the transmission data of the mirrors M10 to M1, namely the reflectivity thereof for the angle of incidence of an illumination light ray incident centrally on the respective mirror. The overall transmission is specified as a proportional factor remaining from an incident intensity after reflection at all mirrors in the projection optical unit.

The sixth table specifies an edge of the stop AS as a polygonal chain in local coordinates xyz. This stop is arranged in the imaging light beam path between the mirrors M9 and M10. As described above, the stop is decentred and tilted. The aperture stop edge serves to define an outer limit of a pupil of the projection optical unit 7. In addition to the aperture stop AS, the projection optical unit 7 may also have further aperture stops which are not described here. In addition to the aperture stop AS, the projection optical unit 7 may have at least one obscuration stop for defining an obscured region situated in the interior of the pupil-imaging optical unit 7. Two obscuration stops are provided in the projection optical unit 7. One of these obscuration stops lies on the mirror M9 and the other one lies on the mirror M10. Such an obscuration stop may, alternatively or additionally, lie in the arrangement plane of the aperture stop AS such that the aperture stop AS defines both an outer boundary of the pupil with a first edge contour and an inner boundary of the pupil with a second edge contour.

An edge of a stop surface of the stop AS (cf., also, the table) emerges from intersection points on the stop surface of all rays of the illumination light 3 which, on the image side, propagate at selected field points in the direction of the stop surface with a complete image-side telecentric aperture. To predetermine the edge of the stop surface of the stop AS, use is made of the intersection points on the stop surface of all rays of the illumination light 3 which, on the image side, propagate from the field centre point in the direction of the stop surface with a complete image-side telecentric aperture. In principle, there may also be a different selection of the employed image-side field points when defining the stop. The "field centre point" and "overall field" selections, specified above, are the possible extreme situations in this case.

When the stop is embodied as an aperture stop, the edge is an inner edge. In the case of an embodiment as an obscuration stop, the edge is an outer edge.

The stop AS can lie in a plane or else have a three-dimensional embodiment. The extent of the stop AS can be smaller in the scanning direction (y) than in the cross scanning direction (x).

The non-illuminated obscuration region in the system pupil can be round, elliptical, square or rectangular. Moreover, this surface in the system pupil which cannot be illuminated can be decentred in the x-direction and/or in the y-direction in relation to a centre of the system pupil.

TABLE 1

| Exemplary embodiment | FIG. 2/3 |
|---|---|
| NA | 0.45 |
| Wavelength | 6.7 nm |
| beta_x | 4.8 |
| beta_y | −9.6 |
| Field_dimension_x | 26.0 mm |
| Field_dimension_y | 1.2 mm |
| Field_curvature | 0.01/mm |
| Stop | AS |

TABLE 2

| Surface | Radius_x[mm] | Power_x[1/mm] | Radius_y[mm] | Power_y[1/mm] | Operating mode |
|---|---|---|---|---|---|
| M10 | −961.6144466 | 0.0020668 | −778.1556786 | 0.0025864 | REFL |
| M9 | −3549.5601410 | 0.0005634 | 479.6400618 | −0.0041698 | REFL |
| M8 | −620.8460283 | 0.0008058 | 7113.1614570 | −0.0011240 | REFL |
| M7 | −756.3513402 | 0.0006395 | −5014.9275129 | 0.0016491 | REFL |
| M6 | −1417.7690170 | 0.0002887 | 19382.9071106 | −0.0005041 | REFL |
| M5 | −5516.9441039 | 0.0000734 | −3790.9287721 | 0.0026038 | REFL |
| M4 | −80255.931716 | 0.0000051 | −3861.9193175 | 0.0025093 | REFL |
| M3 | 2865.0062520 | −0.0001599 | −13352.6807188 | 0.0006538 | REFL |
| M2 | 3837.7582418 | −0.0001010 | 4704.6489122 | −0.0021935 | REFL |
| M1 | −3810.8666433 | 0.0005161 | −1340.8257677 | 0.0015167 | REFL |

TABLE 3a

| Coefficient | M10 | M9 | M8 |
|---|---|---|---|
| KY | 0.00000000 | 0.00000000 | 0.00000000 |
| KX | 0.00000000 | 0.00000000 | 0.00000000 |
| RX | −961.61444660 | −3549.56014100 | −620.84602830 |
| C7 | 4.122838e−08 | −2.43451201e−07 | 1.21077589e−06 |
| C9 | 1.73793078e−08 | 8.2540602e−07 | 2.39494778e−07 |
| C10 | −6.02821066e−12 | 4.80631486e−10 | 3.71758146e−10 |
| C12 | −4.01766351e−11 | −3.46236258e−10 | −1.11440751e−09 |
| C14 | −9.03062505e−12 | 1.17817415e−09 | 7.77249821e−10 |
| C16 | 3.08588436e−14 | 1.12613826e−12 | 1.63296635e−12 |
| C18 | 8.65663335e−14 | 1.41409841e−12 | 3.57926329e−12 |
| C20 | 2.17991987e−14 | 2.00986224e−12 | 2.68200572e−12 |
| C21 | −4.27010051e−17 | −3.61671448e−16 | 1.03589706e−15 |
| C23 | −7.78826411e−17 | 1.71334057e−15 | −2.82633589e−15 |
| C25 | −9.11967025e−17 | −1.2382258e−15 | 4.66511761e−15 |
| C27 | −3.08060418e−17 | 3.99850272e−14 | 8.44666964e−15 |
| C29 | 8.77951791e−20 | −2.12325806e−18 | 1.12276048e−19 |
| C31 | 1.77169117e−19 | 1.74659086e−18 | 2.08872559e−17 |
| C33 | 1.34766609e−19 | −6.31367756e−17 | 3.21976285e−17 |
| C35 | 2.03490892e−20 | 8.78301001e−17 | 1.83443084e−17 |
| C36 | −3.19683784e−23 | 2.32702114e−21 | 2.52757672e−21 |
| C38 | −2.04574776e−22 | −6.28599598e−21 | 9.68622943e−21 |
| C40 | −2.71616731e−22 | 7.86319294e−20 | 1.47383978e−20 |
| C42 | −2.35280835e−22 | −2.5703768e−19 | 8.20492642e−20 |
| C44 | −6.20833545e−23 | 1.91106883e−19 | 2.10433981e−20 |
| C46 | −1.56150681e−26 | 9.08862194e−24 | −5.04005572e−24 |
| C48 | 3.48982966e−25 | −3.65624507e−23 | 1.19741441e−23 |
| C50 | 3.37807257e−25 | 1.70169986e−22 | 1.98008305e−22 |
| C52 | 1.74667593e−25 | −3.60091364e−22 | 1.73954473e−22 |
| C54 | 1.73003933e−26 | −1.41369846e−21 | −4.64572764e−24 |
| C55 | −9.14974685e−29 | −2.1067628e−27 | 1.75351809e−27 |
| C57 | −1.38158184e−28 | 6.42122467e−26 | 5.63336949e−26 |
| C59 | −5.04027539e−28 | 4.30777188e−26 | 2.48606491e−25 |
| C61 | −6.42124688e−28 | 1.08929859e−24 | 6.98967803e−26 |
| C63 | −3.96873549e−28 | 2.27314455e−24 | 1.76228481e−25 |
| C65 | −9.69514873e−29 | 1.32345147e−24 | −3.71019497e−26 |
| C67 | 2.08984524e−31 | 0 | 0 |
| C69 | 5.02882666e−31 | 0 | 0 |
| C71 | 1.02647652e−30 | 0 | 0 |
| C73 | 8.42552583e−31 | 0 | 0 |

TABLE 3a-continued

| Coefficient | M10 | M9 | M8 |
|---|---|---|---|
| C75 | 2.72643186e−31 | 0 | 0 |
| C77 | 1.00411079e−32 | 0 | 0 |
| C78 | −1.29738103e−34 | 0 | 0 |
| C80 | −1.03141007e−33 | 0 | 0 |
| C82 | −2.90640927e−33 | 0 | 0 |
| C84 | −4.91820062e−33 | 0 | 0 |
| C86 | −4.59378867e−33 | 0 | 0 |
| C88 | −2.19237133e−33 | 0 | 0 |
| C90 | −3.82974968e−34 | 0 | 0 |

TABLE 3b

| Coefficient | M7 | M6 | M5 |
|---|---|---|---|
| KY | 0.00000000 | 0.00000000 | 0.00000000 |
| KX | 0.00000000 | 0.00000000 | 0.00000000 |
| RX | −756.35134020 | −1417.76901700 | −5516.94410400 |
| C7 | 1.98220318e−07 | −7.69616538e−08 | 6.05224345e−08 |
| C9 | 6.00603819e−08 | −3.90780933e−08 | 3.12018629e−08 |
| C10 | 6.02350889e−12 | −1.86964749e−11 | −5.72002104e−11 |
| C12 | −1.27668681e−10 | 4.77340782e−11 | −4.47369532e−11 |
| C14 | −3.15080226e−10 | 9.12140764e−11 | −5.83538751e−11 |
| C16 | 2.54093551e−13 | −8.88703214e−14 | 8.6392774e−14 |
| C18 | 3.7613193e−13 | −2.09563713e−13 | 6.30738356e−14 |
| C20 | 4.79136055e−13 | −1.68864122e−13 | 4.02478525e−14 |
| C21 | 1.32777524e−16 | −7.60979967e−17 | 9.14405018e−17 |
| C23 | −3.66667319e−16 | 2.06771154e−17 | −1.9170011e−17 |
| C25 | −9.07083339e−16 | 3.94667017e−16 | −9.53595736e−18 |
| C27 | −1.49225078e−15 | −2.21726735e−17 | −4.66848683e−17 |
| C29 | 3.31159671e−19 | 3.57673037e−19 | 1.27524055e−19 |
| C31 | 1.15480822e−18 | −4.54354127e−19 | 9.35232931e−20 |
| C33 | 2.05720734e−18 | 2.1247835e−20 | −4.46137732e−20 |
| C35 | 1.96729763e−18 | 1.07285249e−18 | 7.76796903e−20 |
| C36 | −1.01035392e−22 | −2.86859982e−22 | −5.35868247e−23 |
| C38 | −9.3366137e−22 | 3.82880588e−22 | 4.26827946e−22 |
| C40 | −1.73635173e−21 | 9.41295218e−22 | −6.4176409e−23 |
| C42 | −4.12763021e−21 | −2.34899679e−21 | −8.86880044e−23 |
| C44 | −9.7707508e−21 | −5.61062446e−22 | −1.73529402e−22 |
| C46 | 5.23570404e−25 | −8.69056492e−25 | −4.39387485e−25 |
| C48 | −5.14805032e−25 | −3.99864655e−24 | −9.89421191e−25 |
| C50 | −3.62299272e−24 | 1.16686643e−24 | −1.02164133e−25 |
| C52 | 2.79625697e−23 | −3.15598564e−24 | 4.11571954e−25 |
| C54 | 8.63301477e−23 | −1.09955675e−23 | 2.28682815e−25 |
| C55 | 3.83909963e−28 | 3.48469972e−28 | −4.15214892e−28 |
| C57 | 3.87820551e−28 | 4.78488112e−27 | 7.65885169e−28 |
| C59 | 6.17515464e−27 | 1.00474213e−27 | −7.64939976e−29 |
| C61 | 2.17592246e−26 | 1.76244813e−27 | 1.98832884e−28 |
| C63 | −1.27629678e−25 | 1.96371307e−27 | −3.96054581e−28 |
| C65 | −2.51085462e−25 | 2.4859618e−26 | −1.20255428e−28 |

TABLE 3c

| Coefficient | M4 | M3 | M2 |
|---|---|---|---|
| KY | 0.00000000 | 0.00000000 | 0.02969487 |
| KX | 0.00000000 | 0.00000000 | 0.00000000 |
| RX | −80255.93172000 | 2865.00625200 | 3837.75824200 |
| C7 | 6.84371172e−08 | 6.46268825e−09 | −1.05057834e−07 |
| C9 | 3.05405131e−08 | 1.11411088e−07 | −9.66596781e−08 |
| C10 | 8.68997619e−11 | −5.22442392e−11 | −1.51263499e−10 |
| C12 | 2.1969297e−12 | −1.46806264e−10 | −4.59402492e−10 |
| C14 | 1.40081074e−10 | −1.22800751e−10 | 9.8916743e−11 |
| C16 | 1.52876611e−13 | 1.84203798e−13 | −4.54004845e−14 |
| C18 | −7.69717861e−14 | 4.86612535e−13 | 1.58845105e−12 |
| C20 | 4.00159137e−13 | 1.9467882e−13 | 1.28084536e−13 |
| C21 | 1.46361577e−16 | 1.07865954e−16 | 4.38481837e−17 |
| C23 | 2.69089086e−16 | −5.33034271e−16 | 3.00718483e−15 |
| C25 | −6.04995808e−16 | 5.12880944e−16 | −1.80290226e−15 |
| C27 | 3.04634382e−16 | 5.44487089e−16 | −5.80699627e−16 |
| C29 | 1.63669377e−19 | 2.69599038e−19 | 1.2772278e−18 |
| C31 | 5.71139265e−19 | −2.77021052e−18 | −1.12674253e−17 |
| C33 | −2.0569781e−18 | −2.68401626e−19 | −1.47419704e−18 |
| C35 | −3.76959861e−18 | 1.85847569e−18 | −6.35049596e−19 |

TABLE 3c-continued

| Coefficient | M4 | M3 | M2 |
|---|---|---|---|
| C36 | 7.41332873e−22 | −1.69651914e−21 | 8.1242866e−22 |
| C38 | −5.26804588e−22 | 1.47913706e−21 | −1.02729033e−20 |
| C40 | 2.29138809e−21 | −2.23206068e−21 | 2.05904697e−20 |
| C42 | 2.53005421e−21 | −4.92753784e−23 | 7.36265223e−21 |
| C44 | −1.38378144e−20 | −5.03266549e−21 | 1.04244628e−20 |
| C46 | −9.98595148e−25 | −2.29016325e−25 | −3.78523909e−24 |
| C48 | −2.62255637e−24 | −1.03009976e−23 | 2.48506394e−23 |
| C50 | 4.63243161e−24 | −1.27800452e−23 | −1.23509829e−23 |
| C52 | 2.79922972e−23 | 1.51095825e−25 | −4.17262005e−24 |
| C54 | 1.42491041e−23 | −2.20603372e−23 | −2.85772948e−23 |
| C55 | −5.25786519e−27 | 7.14725502e−27 | −6.43766455e−28 |
| C57 | 5.80142861e−28 | 6.47095115e−27 | 1.5593196e−26 |
| C59 | −1.72103113e−26 | −3.10095736e−26 | −1.88777446e−26 |
| C61 | −2.52341494e−26 | −4.78198882e−26 | 3.68931638e−27 |
| C63 | 3.78238932e−27 | 6.05955815e−26 | −6.34223347e−28 |
| C65 | 1.13278648e−25 | 1.8284345e−26 | 2.68127617e−26 |

TABLE 3d

| Coefficient | M1 |
|---|---|
| KY | 0.00000000 |
| KX | 0.00000000 |
| RX | −3810.86664300 |
| C7 | −3.07724748e−08 |
| C9 | −1.1092234e−09 |
| C10 | 5.42603668e−12 |
| C12 | 4.34272696e−11 |
| C14 | 5.20715764e−11 |
| C16 | −5.91448696e−14 |
| C18 | 2.99993389e−13 |
| C20 | 7.92455179e−13 |
| C21 | 2.77299977e−18 |
| C23 | 8.44040962e−17 |
| C25 | 1.72365307e−15 |
| C27 | 2.96867047e−15 |
| C29 | −9.37461721e−20 |
| C31 | 9.48636629e−19 |
| C33 | 1.51121919e−17 |
| C35 | −6.94799531e−17 |
| C36 | 5.56491129e−24 |
| C38 | −1.14082819e−21 |
| C40 | −7.85113088e−21 |
| C42 | 6.16008871e−20 |
| C44 | −3.69867602e−19 |
| C46 | 1.38831435e−25 |
| C48 | −5.29874848e−24 |
| C50 | −1.13734657e−23 |
| C52 | −8.97248374e−23 |
| C54 | 9.80001404e−22 |
| C55 | −1.0656534e−28 |
| C57 | −3.06386065e−28 |
| C59 | −2.94379006e−27 |
| C61 | −1.47445886e−25 |
| C63 | −2.04830046e−24 |
| C65 | 1.39915328e−23 |

TABLE 4a

| Surface | DCX | DCY | DCZ |
|---|---|---|---|
| Image field | 0.00000000 | 0.00000000 | 0.00000000 |
| M10 | 0.00000000 | 0.00000000 | 726.26825857 |
| AS | 0.00000000 | 114.99787753 | 222.43108435 |
| M9 | 0.00000000 | 136.95980546 | 126.20986754 |
| M8 | 0.00000000 | −102.28561601 | 1172.14414151 |
| M7 | 0.00000000 | 1.95119662 | 1533.55503523 |
| M6 | 0.00000000 | 606.64992938 | 2158.01874657 |
| M5 | 0.00000000 | 1053.47672037 | 2341.26818301 |
| M4 | 0.00000000 | 2075.95201296 | 2321.98264847 |
| M3 | 0.00000000 | 2479.49763735 | 2134.64912748 |
| M2 | 0.00000000 | 2704.66987413 | 1852.70145894 |
| M1 | 0.00000000 | 2888.73001061 | 1221.70644087 |
| Object field | 0.00000000 | 3021.79508673 | 2868.97685767 |

TABLE 4b

| Surface | TLA[deg] | TLB[deg] | TLC[deg] |
|---|---|---|---|
| Image field | −0.00000000 | 0.00000000 | −0.00000000 |
| M10 | 6.42858928 | 0.00000000 | −0.00000000 |
| AS | −17.14246277 | 180.00000000 | 0.00000000 |
| M9 | 192.87063810 | −0.00000000 | −0.00000000 |
| M8 | 88.39783563 | 0.00000000 | −0.00000000 |
| M7 | 59.91640627 | −0.00000000 | −0.00000000 |
| M6 | 34.11020311 | −0.00000000 | 0.00000000 |
| M5 | 10.60930228 | −0.00000000 | −0.00000000 |
| M4 | −12.99109198 | −0.00000000 | −0.00000000 |
| M3 | −38.14483096 | −0.00000000 | −0.00000000 |
| M2 | −62.56308442 | 0.00000000 | 0.00000000 |
| M1 | 185.82179813 | −0.00000000 | −0.00000000 |
| Object field | 0.38172435 | 0.00000000 | 0.00000000 |

TABLE 5

| Surface | AOI[deg] | Reflectivity |
|---|---|---|
| M10 | 6.42858928 | 0.647 |
| M9 | 0.01345953 | 0.291 |
| M8 | 75.51373800 | 0.764 |
| M7 | 76.00483264 | 0.763 |
| M6 | 78.18896421 | 0.767 |
| M5 | 78.31013496 | 0.776 |
| M4 | 78.08947079 | 0.770 |
| M3 | 76.75679022 | 0.773 |
| M2 | 78.82495632 | 0.774 |
| M1 | 10.44007378 | 0.629 |
| Overall transmission | | 0.020 |

TABLE 6

| X[mm] | Y[mm] | Z[mm] |
|---|---|---|
| 0.00000000 | 132.80229462 | 0.00000000 |
| −34.55713145 | 131.35951691 | 0.00000000 |
| −68.29061856 | 127.02179719 | 0.00000000 |
| −100.38643567 | 119.76879342 | 0.00000000 |
| −130.05397146 | 109.59066928 | 0.00000000 |
| −156.54719905 | 96.51757053 | 0.00000000 |
| −179.19248193 | 80.64902007 | 0.00000000 |
| −197.41654143 | 62.17477925 | 0.00000000 |
| −210.76616416 | 41.38135861 | 0.00000000 |
| −218.91636786 | 18.64429089 | 0.00000000 |
| −221.67132151 | −5.58642687 | 0.00000000 |
| −218.96468570 | −30.79671678 | 0.00000000 |
| −210.86176036 | −56.40803396 | 0.00000000 |
| −197.56060372 | −81.76967486 | 0.00000000 |
| −179.38857244 | −106.15490156 | 0.00000000 |
| −156.79392006 | −128.77181569 | 0.00000000 |
| −130.33439869 | −148.79395729 | 0.00000000 |
| −100.66380815 | −165.40937807 | 0.00000000 |
| −68.51564422 | −177.88300337 | 0.00000000 |
| −34.68350686 | −185.62426280 | 0.00000000 |
| −0.00000000 | −188.24913322 | 0.00000000 |
| 34.68350686 | −185.62426280 | 0.00000000 |
| 68.51564422 | −177.88300337 | 0.00000000 |
| 100.66380815 | −165.40937807 | 0.00000000 |
| 130.33439869 | −148.79395729 | 0.00000000 |
| 156.79392006 | −128.77181569 | 0.00000000 |
| 179.38857244 | −106.15490156 | 0.00000000 |
| 197.56060372 | −81.76967486 | 0.00000000 |
| 210.86176036 | −56.40803396 | 0.00000000 |
| 218.96468570 | −30.79671678 | 0.00000000 |
| 221.67132151 | −5.58642687 | 0.00000000 |
| 218.91636786 | 18.64429089 | 0.00000000 |
| 210.76616416 | 41.38135861 | 0.00000000 |
| 197.41654143 | 62.17477925 | 0.00000000 |
| 179.19248193 | 80.64902007 | 0.00000000 |
| 156.54719905 | 96.51757053 | 0.00000000 |
| 130.05397146 | 109.59066928 | 0.00000000 |
| 100.38643567 | 119.76879342 | 0.00000000 |
| 68.29061856 | 127.02179719 | 0.00000000 |
| 34.55713145 | 131.35951691 | 0.00000000 |

An étendue of the projection optical unit 7 is 6.32 mm$^2$. The étendue is defined as image field surface×NA$^2$.

A pupil obscuration of the projection optical unit 7 is 18% of the numerical aperture of the projection optical unit 7. Hence, a surface portion of 0.18$^2$ of a pupil of the projection optical unit 7 is obscured. The projection optical unit 7 is telecentric on the object side and image side. Thus, the chief rays 16 extend parallel to one another between the object field 4 and the mirror M1 on the one hand and between the mirror M10 and the image field on the other hand, wherein an angle deviation over the entire field is negligibly small, in particular less than 0.1°. An object-image offset $d_{OIS}$ is approximately 3000 mm. The mirrors of the projection optical unit 7 can be housed in a cuboid with xyz-edge lengths of 693 mm×3285 mm 2292 mm.

The object plane 5 extends at an angle of 0.4° in relation to the image plane 9.

A working distance between the mirror M9 closest to the wafer and the image plane 9 is 102 mm. A mean wavefront aberration rms is 15.74 mλ, i.e. it is defined as dependent on the design wavelength.

The mirrors M1, M4, M5, M7 and M10 have negative values for the radius, i.e. they are, in principle, concave mirrors. The mirror M2 has positive values for the radius, i.e. it is, in principle, a convex mirror.

The mirrors M3, M6, M8 and M9 have different signs in respect of their x-radius value and y-radius value, i.e. they have a saddle-shaped basic form.

In order to produce a microstructured or nanostructured component, the projection exposure apparatus 1 is used as follows: First, the reflection mask 10 or the reticle and the substrate or the wafer 11 are provided. Subsequently, a structure on the reticle 10 is projected onto a light-sensitive layer of the wafer 11 with the aid of the projection exposure apparatus 1. Then, a microstructure or nanostructure on the wafer 11, and hence the microstructured component, is produced by developing the light-sensitive layer.

What is claimed is:
1. A projection optical unit, comprising:
a plurality of mirrors configured to image an object field into an image field with illumination light,
wherein:
the plurality of mirrors comprises more than six mirrors comprising an NI mirror arranged so that a reflection surface of the NI mirror is impinged upon with a maximum angle of incidence of a chief ray of a central field point;

the maximum angle of incidence is less than 45°;

a ray portion of the chief ray incident on the reflection surface and a ray portion of the chief ray emerging from the reflection surface lie in a plane of incidence (yz); and a mirror dimension Dx of the NI mirror in a plane of extent (xz) perpendicular to the plane of incidence (yz) satisfies the following relationship:

$$4\ LLWx/IWPV_{max} < Dx,$$

wherein:

LLWx: étendue of the projection optical unit in the plane of extent (xz);

$IWPV_{max}$: maximum difference between a maximum angle of incidence and a minimum angle of incidence of the illumination light, respectively, at the same location and determined on the entire reflection surface of the NI mirror; and the projection optical unit is an EUV lithography projection optical unit.

2. The projection optical unit of claim 1, wherein the mirror dimension Dx of the NI mirror is at least 200 mm.

3. The projection optical unit of claim 1, wherein $IWPV_{max}$ is at least 3°.

4. The projection optical unit of claim 3, wherein $IWPV_{max}$ is at most 10°.

5. The projection optical unit of claim 1, wherein $IWPV_{max}$ is at most 10°.

6. The projection optical unit of claim 1, wherein the projection optical unit is telecentric on the object side.

7. The projection optical unit of claim 1, wherein:

the image field which is spanned by a coordinate x perpendicular to a plane of incidence (yz) and a coordinate y perpendicular thereto; and an aspect ratio $x_{bf}/y_{bf}$ of the image field is greater than 13.

8. An optical system, comprising:

an illumination optical unit configured to illuminate the object field with the imaging light; and a projection optical unit according to claim 1.

9. A projection exposure apparatus, comprising:

an EUV light source;

an illumination optical unit configured to illuminate the object field with the imaging light; and a projection optical unit according to claim 1.

10. A method of using a projection exposure apparatus comprising an illumination optical unit, an imaging optical unit and an EUV light source, the method comprising:

using the illumination optical unit to illuminate a reticle with light generated by the EUV light source; and using the projection optical unit to project at least a portion of the illuminated reticle onto a light-sensitive layer, wherein the projection optical unit comprises a projection optical unit according to claim 1.

11. A projection optical unit, comprising:

a plurality of mirrors configured to image an object field into an image field with illumination light, wherein:

the plurality of mirrors comprises a GI mirror arranged so that a reflection surface of the mirror is impinged upon with a maximum angle of incidence of a chief ray of a central field point;

the maximum angle of incidence being greater than 45°, wherein a ray portion of the chief ray incident on the reflection surface and a ray portion of the chief ray emerging from the reflection surface lie in a plane of incidence (yz);

a mirror dimension Dy of the at least one GI mirror in the plane of incidence satisfies the following relationship:

$$4\ LLWy/(IWPV_{max}\cos(a)) < Dy,$$

wherein:

LLWy: étendue of the projection optical unit in the plane of incidence (yz);

$IWPV_{max}$: maximum difference between a maximum angle of incidence and a minimum angle of incidence of the illumination light on the reflection surface of the GI mirror;

a: angle of incidence of a chief ray of the central field point on the reflection surface of the GI mirror; and the projection optical unit is an EUV lithography projection optical unit.

12. The projection optical unit of claim 11, wherein the mirror dimension Dy of the at least one GI mirror is at least 100 mm.

13. The projection optical unit of claim 11, wherein $IWPV_{max}$ is at least 0.25°.

14. The projection optical unit of claim 11, wherein $IWPV_{max}$ is at most 4°.

15. The projection optical unit of claim 11, wherein the plurality of mirrors further comprises an NI mirror arranged so that a reflection surface of the NI mirror is impinged upon with a maximum angle of incidence of a chief ray of a central field point, wherein:

the maximum angle of incidence upon the NI mirror of the chief ray of the central field point is less than 45°;

a ray portion of the chief ray incident on the reflection surface of the NI mirror and a ray portion of the chief ray emerging from the reflection surface of the NIT mirror lie in a plane of incidence (yz); and a mirror dimension Dx of the NI mirror in a plane of extent (xz) perpendicular to the plane of incidence (yz) satisfies the following relationship:

$$4\ LLWy/(IWPV'_{max}\cos(a)) < Dy,$$

wherein:

LLWx: étendue of the projection optical unit in the plane of extent (xz);

$IWPV'_{max}$: maximum difference between a maximum angle of incidence and a minimum angle of incidence of the illumination light, respectively, at the same location and determined on the entire reflection surface of the NI mirror.

16. The projection optical unit of claim 11, wherein the projection optical unit is telecentric on the object side.

17. The projection optical unit of claim 11, wherein:

the image field which is spanned by a coordinate x perpendicular to a plane of incidence (yz) and a coordinate y perpendicular thereto; and an aspect ratio $x_{bf}/y_{bf}$ of the image field is greater than 13.

18. An optical system, comprising:

an illumination optical unit configured to illuminate the object field with the imaging light; and a projection optical unit according to claim 11.

19. A projection exposure apparatus, comprising:

an EUV light source;

an illumination optical unit configured to illuminate the object field with the imaging light; and a projection optical unit according to claim 11.

20. A method of using a projection exposure apparatus comprising an illumination optical unit, an imaging optical unit and an EUV light source, the method comprising:
- using the illumination optical unit to illuminate a reticle with light generated by the EUV light source; and
- using the projection optical unit to project at least a portion of the illuminated reticle onto a light-sensitive layer,
- wherein the projection optical unit comprises a projection optical unit according to claim 11.

21. The projection optical unit of claim 1, wherein the plurality of mirrors comprises at most 10 mirrors.

* * * * *

UNITED STATES PATENT AND TRADEMARK OFFICE
CERTIFICATE OF CORRECTION

PATENT NO. : 10,545,323 B2
APPLICATION NO. : 16/222512
DATED : January 28, 2020
INVENTOR(S) : Markus Schwab, Hartmut Enkisch and Thomas Schicketanz It is certified that error appears in the above-identified patent and that said Letters Patent is hereby corrected as shown below:

In the Specification

Column 1, Line 46 (approx.), after "surface" delete "face";

Column 4, Line 49, delete "FIG. 4" and insert -- FIGS. 4A-4D --;

Column 6, Line 38, delete "FIGS. 4 and 5." and insert -- FIGS. 4A-4D and 5A-5D. --;

Column 8, Line 40, delete "FIGS. 4 and 5" and insert -- FIGS. 4A-4D and 5A-5D --;

Column 8, Line 50, delete "FIGS. 4 and 5" and insert -- FIGS. 4A-4D and 5A-5D --;

Column 8, Line 53, delete "FIG. 4," and insert -- FIGS. 4A-4D, --;

Column 8, Line 54, delete "FIG. 5," and insert -- FIGS. 5A-5D, --;

Column 8, Line 60, delete "FIGS. 4 and 5" and insert -- FIGS. 4A-4D and 5A-5D --;

Column 9, Line 10, delete "FIG. 4" and insert -- FIGS. 4A-4D --;

Column 9, Line 11, delete "FIG. 5," and insert -- FIGS. 5A-5D, --;

Column 10, Line 51 (approx.), delete "FIG. 5)." and insert -- FIGS. 5A-5D). --;

Column 10, Line 51 (approx.), delete "With" and insert -- with --;

Column 18, Line 37 (approx.), after "3285 mm" insert -- × --;

Signed and Sealed this
Thirtieth Day of June, 2020

Andrei Iancu
*Director of the United States Patent and Trademark Office*

CERTIFICATE OF CORRECTION (continued)
U.S. Pat. No. 10,545,323 B2

In the Claims

Column 20, Line 37 (approx.), Claim 15, delete "NIT" and insert -- NI --;

Column 20, Line 42 (approx.), Claim 15, delete "*4 LLWy/IWPV'max COS(a))<Dy,*" and insert -- $4\ LLWx/IWPV'_{max} < Dx,$ --.